(12) United States Patent
Park et al.

(10) Patent No.: US 9,831,240 B2
(45) Date of Patent: Nov. 28, 2017

(54) ELEVATED SOURCE DRAIN SEMICONDUCTOR DEVICE WITH L-SHAPED SPACERS AND FABRICATING METHOD THEREOF

(71) Applicant: Samsung Electronics Co., Ltd., Suwon-si (KR)

(72) Inventors: Min-Yeop Park, Seoul (KR); Leonelli Daniele, Pyeongtaek-si (KR); Shigenobu Maeda, Seongnam-si (KR); Han-Su Oh, Yongin-si (KR); Woong-Gi Kim, Hwaseong-si (KR); Jong-Hyuk Lee, Seoul (KR); Ju-Seob Jeong, Busan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/167,236

(22) Filed: Jan. 29, 2014

(65) Prior Publication Data

US 2015/0014788 A1 Jan. 15, 2015

(30) Foreign Application Priority Data

Jul. 12, 2013 (KR) ........................ 10-2013-0082307

(51) Int. Cl.
*H01L 27/088* (2006.01)
*H01L 29/66* (2006.01)
*H01L 29/78* (2006.01)
*H01L 21/8234* (2006.01)

(52) U.S. Cl.
CPC .. *H01L 27/0886* (2013.01); *H01L 21/823412* (2013.01); *H01L 21/823431* (2013.01); *H01L 29/66545* (2013.01); *H01L 29/66795* (2013.01); *H01L 29/785* (2013.01)

(58) Field of Classification Search
CPC .......... H01L 27/0886; H01L 29/66545; H01L 21/823431; H01L 21/823412; H01L 29/785; H01L 29/66795
USPC ....................................................... 257/401
See application file for complete search history.

(56) References Cited

U.S. PATENT DOCUMENTS

| | | | |
|---|---|---|---|
| 4,590,663 A | 5/1986 | Haken | |
| 5,817,563 A | 10/1998 | Lim | |
| 6,171,959 B1 * | 1/2001 | Nagabushnam | 438/683 |
| 6,693,012 B2 | 2/2004 | Mouli et al. | |
| 6,884,643 B2 * | 4/2005 | Nakanishi et al. | 438/17 |
| 6,995,066 B2 * | 2/2006 | Shim | 438/303 |
| 7,141,852 B2 | 11/2006 | Kim | |
| 8,004,048 B2 | 8/2011 | Yoo | |
| 8,017,997 B2 * | 9/2011 | Divakaruni et al. | 257/346 |
| 9,142,649 B2 * | 9/2015 | Liu et al. | |
| 9,209,182 B2 * | 12/2015 | Chern et al. | |

(Continued)

FOREIGN PATENT DOCUMENTS

JP 2011066042 3/2011
JP 2011066042 A * 3/2011

(Continued)

*Primary Examiner* — Phat X Cao
*Assistant Examiner* — Mohammad M Hoque
(74) *Attorney, Agent, or Firm* — Onello & Mello, LLP

(57) ABSTRACT

A semiconductor device includes a gate on a substrate, a gate insulating layer along a sidewall and a bottom surface of the gate, and an L-shaped spacer structure on both sidewalls of the gate. A structure extends the distance between the gate and source/drain regions to either side of the gate.

20 Claims, 18 Drawing Sheets

(56) References Cited

U.S. PATENT DOCUMENTS

| | | | |
|---|---|---|---|
| 2003/0027414 A1* | 2/2003 | Ko | 438/595 |
| 2005/0112817 A1* | 5/2005 | Cheng et al. | 438/219 |
| 2005/0124104 A1* | 6/2005 | Jung | 438/197 |
| 2006/0157797 A1* | 7/2006 | Tateshita | 257/369 |
| 2007/0105295 A1 | 5/2007 | Kim | |
| 2007/0194387 A1* | 8/2007 | Dyer | H01L 21/823418 257/369 |
| 2007/0202669 A1* | 8/2007 | Fukuda et al. | 438/507 |
| 2008/0157208 A1* | 7/2008 | Fischer et al. | 257/368 |
| 2009/0039426 A1* | 2/2009 | Cartier | H01L 21/28079 257/344 |
| 2010/0032733 A1* | 2/2010 | Itou et al. | 257/288 |
| 2010/0038720 A1* | 2/2010 | Anderson | H01L 21/28097 257/369 |
| 2010/0151669 A1* | 6/2010 | Lindert et al. | 438/589 |
| 2011/0254090 A1* | 10/2011 | Cheng et al. | 257/347 |
| 2011/0275188 A1 | 11/2011 | Yoo | |
| 2012/0068268 A1* | 3/2012 | Hsiao | H01L 21/823807 257/368 |
| 2012/0146154 A1 | 6/2012 | Itou et al. | |
| 2012/0187459 A1* | 7/2012 | Pan | H01L 21/823807 257/288 |
| 2012/0241868 A1* | 9/2012 | Tsai et al. | 257/369 |
| 2013/0015522 A1* | 1/2013 | Kutsunai et al. | 257/338 |
| 2013/0187229 A1* | 7/2013 | Cheng et al. | 257/347 |
| 2013/0200470 A1* | 8/2013 | Liu | H01L 29/66795 257/408 |
| 2013/0309837 A1* | 11/2013 | Chang | H01L 27/1104 438/424 |
| 2014/0024181 A1* | 1/2014 | Adam et al. | 438/154 |
| 2014/0124794 A1* | 5/2014 | Weihua | H01L 21/823807 257/77 |

FOREIGN PATENT DOCUMENTS

| | | |
|---|---|---|
| KR | 100236190 | 9/1999 |
| KR | 1020030002660 | 1/2003 |
| KR | 1020030049594 | 6/2003 |
| KR | 1020050070673 | 7/2005 |
| KR | 1020100078511 | 7/2010 |
| KR | 1020100079192 | 7/2010 |

* cited by examiner

ELEVATED SOURCE DRAIN SEMICONDUCTOR DEVICE WITH L-SHAPED SPACERS AND FABRICATING METHOD THEREOF

CROSS-REFERENCE TO RELATED APPLICATION

This application claims priority from Korean Patent Application No. 10-2013-0082307 filed on Jul. 12, 2013 in the Korean Intellectual Property Office, and all the benefits accruing therefrom under 35 U.S.C. 119, the contents of which in its entirety are herein incorporated by reference.

TECHNICAL FIELD

Inventive concepts relate to a semiconductor device and a fabricating method thereof.

BACKGROUND

As electronic products continue to decrease in size in order to deliver more and more features and performance in smaller and smaller packages, the feature sizes of the electronic devices employed by such products, naturally, decrease. When metal oxide semiconductor (MOS) transistors decrease in size, their gate length and channel length below the gate decrease, and, unfortunately, their operating characteristics may deteriorate due to, for example, reduced capacitance between the gate and channel.

One approach to improving the performance of a MOS device, while, at the same time, reducing feature sizes, is to substitute a material having a high dielectric constant for the more conventional silicon oxide layer used for gate insulation in order to reduce leakage current between a device's gate electrode and channel region. Additionally, because the polysilicon generally used as a gate electrode material has a relatively high resistance, metal electrodes may be used instead of polysilicon electrodes.

Multi gate transistors employing a three-dimensional (3D) channel may also be employed in order to increase device density. Such a device may form a fin or a nanowire-shaped silicon body on a substrate, with a gate on a surface of the silicon body has, for example. Such devices may afford improved current control and suppression of short channel effect (SCE), for example.

SUMMARY

In exemplary embodiments in accordance with principles of inventive concepts, a semiconductor device includes a gate on a substrate, a gate insulating layer along a sidewall and a bottom surface of the gate, and an L-shaped spacer structure on both sidewalls of the gate, wherein the spacer structure includes a first portion along the sidewall of the gate and a second portion connected to the first portion and along a top surface of the substrate, extending beyond the portion along the sidewall of the gate.

In exemplary embodiments in accordance with principles of inventive concepts, the top surface of the gate and a top surface of the first portion are disposed on the same plane.

In exemplary embodiments in accordance with principles of inventive concepts a width of the first portion of a spacer structure is constant.

In exemplary embodiments in accordance with principles of inventive concepts, a spacer structure includes first through $n^{th}$ spacers that are sequentially stacked, and n denotes a natural number greater than or equal to "2".

In exemplary embodiments in accordance with principles of inventive concepts, the $n^{th}$ spacer disposed at an outermost portion in the spacer structure of a semiconductor device is provided in an L shape.

In exemplary embodiments in accordance with principles of inventive concepts, each of the first through $n^{th}$ spacers in a semiconductor device is provided in an L shape.

In exemplary embodiments in accordance with principles of inventive concepts, the spacer structure directly contacts with an interlayer insulating layer, and the interlayer insulating layer directly contacts with a sidewall of the first portion and a top surface of the second portion of the spacer structure.

In exemplary embodiments in accordance with principles of inventive concepts, the interlayer insulating layer of a semiconductor device includes a passivation layer formed along a side surface of the spacer structure and a top surface of elevated source/drain.

In exemplary embodiments in accordance with principles of inventive concepts, a low doped drain (LDD) region is disposed in a lower portion of the spacer structure of a semiconductor device.

In exemplary embodiments in accordance with principles of inventive concepts semiconductor device includes elevated a source/drain within a fin on both sides of the gate and contacting with a spacer structure.

In exemplary embodiments in accordance with principles of inventive concepts, a semiconductor device includes a first plug dopant region extended to an inside of an elevated source and a lower portion of the spacer structure and a second plug dopant region formed within the elevated drain.

In exemplary embodiments in accordance with principles of inventive concepts, a semiconductor device includes a second plug dopant that does not overlap a spacer structure.

In exemplary embodiments in accordance with principles of inventive concepts, a first plug dopant region and second plug dopant region are formed through a tilted implant process.

In exemplary embodiments in accordance with principles of inventive concepts a semiconductor device includes an inner spacer between the spacer structure and the gate.

In exemplary embodiments in accordance with principles of inventive concepts, an inner spacer has a chamfered I shape.

In exemplary embodiments in accordance with principles of inventive concepts a semiconductor device includes a fin extended in a first direction, a metal gate extended in a second direction different from the first direction on the fin, and L-shaped spacer structures on each sidewall of the metal gate, the lower extended portions of the spacer structures extending away from the metal gate, wherein a top surface of the metal gate and a top surface of the spacer structure are disposed on the same plane.

In exemplary embodiments in accordance with principles of inventive concepts a semiconductor device includes a substrate on which a first region and a second region are defined, a first transistor on the first region, and including a first gate and L-shaped first spacer structures on each side of the first gate, and a second transistor on the second region, and including a second gate and second spacer structures on each side of the second gate.

In exemplary embodiments in accordance with principles of inventive concepts a first spacer structures include a first portion along a sidewall of the first gate and a second portion extending from the first portion away from the gate.

In exemplary embodiments in accordance with principles of inventive concepts a first transistor includes first elevated source/drains formed on each side of the first gate, the second transistor further includes second elevated source/drains formed on each side of the second gate, and a first distance from a sidewall of the first gate to the first elevated source/drain and a second distance from a sidewall of the second gate to the second elevated source/drain are different from each other.

In exemplary embodiments in accordance with principles of inventive concepts, a first transistor includes first elevated source/drains formed on each side of the first gate, the second transistor further includes second elevated source/drains formed on each side of the second gate, and a first distance from a sidewall of the first gate to the first elevated source/drain and a second distance from a sidewall of the second gate to the second elevated source/drain are different from each other, wherein the first distance is greater than the second distance.

In exemplary embodiments in accordance with principles of inventive concepts, a semiconductor device includes a substrate on which a first region and a second region are defined, a first transistor in the first region, and configured to operate with first driving voltage; and a second transistor in the second region, and configured to operate with second driving voltage less than the first driving voltage, wherein the first transistor is formed in the first region, and includes a first gate, first elevated source/drains on each side of the first gate, and a first plug dopant region tilted within the first elevated source/drain, and the second transistor is formed on the second region, and includes a second gate, second elevated source/drains on each side of the second gate, and a second plug dopant region not tilted within the second elevated source/drain.

In exemplary embodiments in accordance with principles of inventive concepts, a semiconductor device includes a substrate on which a first region and a second region are defined, a first transistor in the first region, and configured to operate with first driving voltage; and a second transistor in the second region, and configured to operate with second driving voltage less than the first driving voltage, wherein the first transistor includes a first gate, a first spacer structure on each side of the first gate, and an inner spacer disposed between the first gate and the first spacer, and the second transistor includes a second gate, a second spacer structure on each side of the second gate.

In exemplary embodiments in accordance with principles of inventive concepts a method of fabricating a semiconductor device includes, forming a fin to be extended in a first direction, forming, on the fin, a sacrificial gate to be extended in a second direction different from the first direction, forming a spacer structure on each sidewall of the sacrificial gate and a top surface of the fin, forming a trench within the fin by removing a portion of the spacer structure and a portion of the fin, wherein a remaining spacer is provided in an L shape; and forming elevated source/drain within the trench.

In exemplary embodiments in accordance with principles of inventive concepts, a method of forming a semiconductor device includes providing a substrate on which a first region, a second region, and a third region are defined, forming a high voltage first conductive type first gate on the first region, forming a regular voltage first conductive type second gate on the second region, and forming a regular voltage second conductive type second gate on the third region, forming a spacer insulating layer along a top surface and a sidewall of the first gate, a top surface and a sidewall of the second gate, and a top surface and a sidewall of the third gate, forming a third trench on both sides of the third gate on the third region using a first mask configured to cover the first region and the second region and expose the third region; and forming a first trench on both sides of the first gate on the first region and forming a second trench on both sides of the second gate on the second region, using a second mask configured to cover the third region and expose a portion of the first region and the second region.

In exemplary embodiments in accordance with principles of inventive concepts, a method of forming a semiconductor device includes a forming a second mask that covers a first gate and covers a portion of the spacer insulating layer configured to contact the substrate on the first region.

In exemplary embodiments in accordance with principles of inventive concepts, a semiconductor device includes a metal gate on a substrate, elevated source/drain regions formed on either side of the gate, an extending structure extending the distance between the metal gate and elevated source/drain regions a distance greater than a process layer thickness.

In exemplary embodiments in accordance with principles of inventive concepts, an extending structure includes an L-shaped spacer structure on both sidewalls of the gate, the spacer structure including a first portion along the sidewall of the gate and a second portion connected to the first portion and along a top surface of the substrate, the second portion extending away from the sidewall of the gate.

In exemplary embodiments in accordance with principles of inventive concepts, a semiconductor device includes dopant plug regions on the sides of elevated source/drain regions.

In exemplary embodiments in accordance with principles of inventive concepts, a semiconductor device includes dopant plug regions, wherein the dopant plug regions are tilted implant dopant plug regions.

In exemplary embodiments in accordance with principles of inventive concepts, a portable electronic device includes a semiconductor device a semiconductor device includes a metal gate on a substrate, elevated source/drain regions formed on either side of the gate, an extending structure extending the distance between the metal gate and elevated source/drain regions a distance greater than a process layer thickness.

BRIEF DESCRIPTION OF THE DRAWINGS

The above and other features and advantages of inventive concepts will become more apparent by describing in detail exemplary embodiments thereof with reference to the attached drawings in which.

DESCRIPTION

Figure 1:
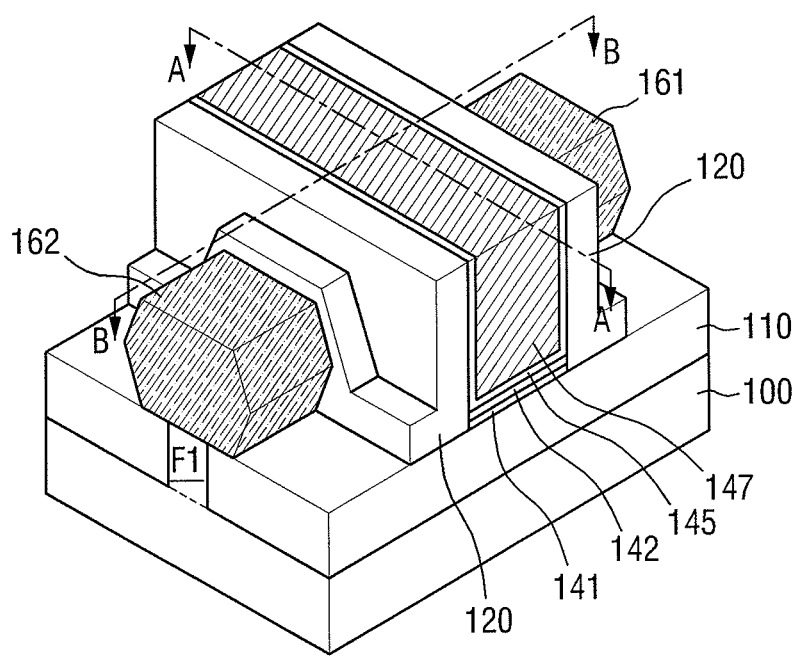
FIG. 1 is a perspective view of a semiconductor device 1 according to a first exemplary embodiment in accordance with principles of inventive concepts.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments in accordance with principles of inventive concepts will be explained in detail with reference to the accompanying drawings.

Figure 2:
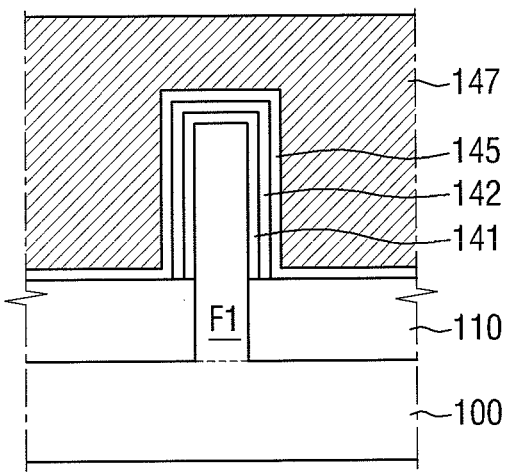
FIG. 2 is a cross-sectional view cut along line A-A of FIG. 1.
Figure 3:
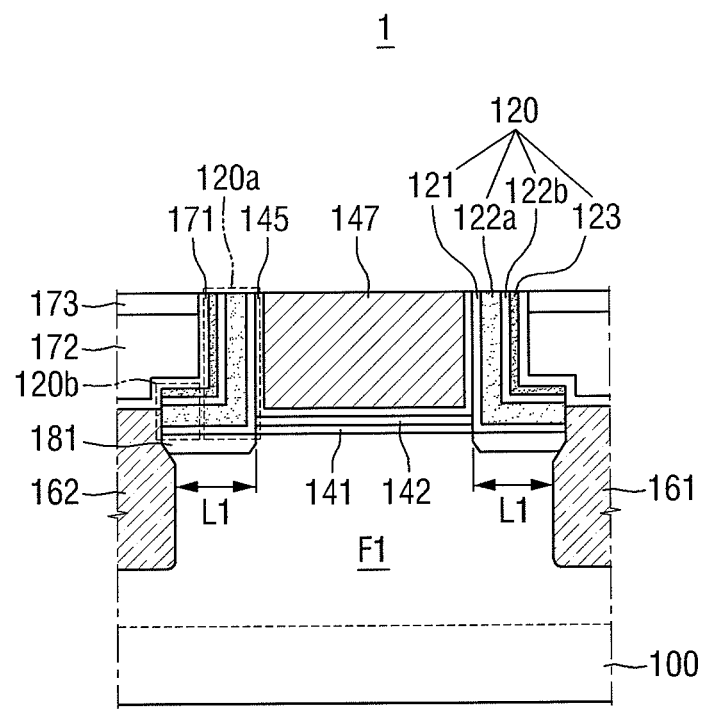
FIG. 3 is a cross-sectional view cut along line B-B of FIG. 1.

FIG. 1 is a perspective view of an exemplary embodiment of a semiconductor device 1 in accordance with principles of inventive concepts, FIG. 2 is a cross-sectional view cut along line A-A of FIG. 1, and FIG. 3 is a cross-sectional view cut along line B-B of FIG. 1. In accordance with principles of inventive concepts, semiconductor device 1 of FIG. 1 may be a high voltage transistor.

Referring to FIGS. 1 to 3, the semiconductor device 1 may include a substrate 100, a field insulating layer 110, first gate insulating layers 141, 142, and 145, a first metal gate 147, a first spacer structure 120, interlayer insulating layers 171, 172, and 173, and first elevated source/drain 161 and 162.

The substrate 100 may include at least one semiconductor material selected from a group including Si, Ge, SiGe, GaP, GaAs, SiC, SiGeC, InAs, and InP. In accordance with principles of inventive concepts, a silicon on insulator (SOI) substrate may be used. Alternatively, the substrate 100 may be a III-V group substrate, for example.

A first fin F1 may extend, may be elongated, along a second direction Y. The first fin F1 may be a portion of the substrate 100 and may include an epitaxial layer grown from the substrate 100, for example.

In exemplary embodiments in accordance with principles of inventive concepts, field insulating layer 110 may be formed on the substrate 100, and the field insulating layer 110 may be formed by stacking at least two insulating layers. The field insulating layer 110 may be formed to surround a lower portion of a sidewall of the first fin F1, and may expose an upper portion of the sidewall of the first fin F1, for example.

The first metal gate 147 may be formed on the first fin F1 to traverse the first fin F1. The first metal gate 147 may extend in a first direction X. The first metal gate 147 may include, for example, a work function adjusting layer, an adhesive layer, and a sealing gate pattern that are sequentially stacked. The work function adjusting layer serves to adjust an operating characteristic of a transistor by adjusting a work function of the transistor. For example, an N-type work function adjusting layer may include a material selected from a group including TiAl, TiAlC, TiAlN, TaC, TiC, and HfSi. In exemplary embodiments in accordance with principles of inventive concepts, the N-type work function adjusting layer may include a TiAlC layer, for example. The adhesive layer may include at least one of TiN and Ti. A P-type work function adjusting layer may include TiN, for example. The sealing gate pattern may include a material selected from Al, W, and Ti. However, inventive concepts are not limited thereto. The first metal gate 147 may be fabricated through a replacement process, for example.

The first gate insulating layers 141, 142, and 145 may be disposed between the first metal gate 147 and the first fin F1. In exemplary embodiments in accordance with principles of inventive concepts semiconductor device 1 is a high-voltage transistor and as a result, the thickness of the first gate insulating layers 141, 142, and 145 is designed to be capable of enduring high voltage. For example, a sacrificial insulating layer 141 and an interface layer 142 may be silicon oxide layers, and a high dielectric layer 145 may be a high dielectric (high-k) material having a high dielectric constant compared to the silicon oxide layer. The high dielectric layer 145 may include a material selected from a group including $HfO_2$, $ZrO_2$, $Ta_2O_5$, $TiO_2$, $SrTiO_3$, and $(Ba,Sr)TiO_3$, for example. The sacrificial insulating layer 141 and the interface layer 142 may be formed on a top surface of the first fin F, and the high dielectric layer 145 may be formed on a sidewall of the first metal gate 147, as well as on the top surface of the first fin F1.

The first elevated source/drain 161 and 162 may be disposed within the first fin F1 at both ends of the first metal gate 147, for example, and the first elevated source/drain 161 and 162 and the first metal gate 147 may be insulated from each other by the spacer structure 120. The first elevated source/drain 161 and 162 may contact spacer structure 120.

Although, in FIG. 3, the top surface of the first elevated source/drain 161 and 162 is illustrated to be lower than a top surface of a second portion 120b of the spacer structure 120, inventive concepts are not limited thereto. For example, the top surface of the first elevated source/drain 161 and 162 may be positioned to be on the same plane as, or higher than, the top surface of the second portion 120b.

In exemplary embodiments in which the semiconductor device 1 according to the first exemplary embodiment is an N-type transistor, the first elevated source/drain 161 and 162 may include a tensile stress material and the source and a drain of the first elevated source/drain 161 and 162 may be the same material as the substrate 100 or a tensile stress material. For example, when the substrate 100 is Si, the source and the drain may be Si or may be a material (for example, SiC) having a lattice constant less than Si.

Alternatively, in exemplary embodiments in which the semiconductor device 1 according to the first exemplary embodiment is a P-type transistor, the first elevated source/drain 161 and 162 may include a compression stress material. For example, the compression stress material may be a material having a lattice constant greater than Si, such as SiGe. In exemplary embodiments in accordance with principles of inventive concepts, compression stress material may improve the mobility of carriers in a channel region by applying the compression stress to the first fin F1.

In exemplary embodiments in accordance with principles of inventive concepts, the first spacer structure 120 may be formed on the sidewall of the first metal gate 147 and be provided in an L-shaped structure.

The first spacer structure 120 may include a first portion 120a formed along the sidewall of the first metal gate 147 and the second portion 120b connected to the first portion 120a and formed along the top surface of the first fin F1.

In exemplary embodiments in accordance with principles of inventive concepts, the width of the first portion 120a may be uniform. That is, the first portion 120a may not be chamfered. In exemplary embodiments in accordance with principles of inventive concepts, in the first portion 120a, the width of a region adjacent to an upper portion of the first metal gate 147 and a width of a region adjacent to a lower portion of the first metal gate 147 may be substantially identical to each other. That is, the widths may be completely identical to each other or may differ slightly due to process conditions, for example.

The top surface of the first portion 120a of the first spacer structure 120 and the top surface of the first metal gate 147 may be positioned on the same plane. In exemplary embodiments in accordance with principles of inventive concepts, the top surface of the first portion 120a and the top surface of the first metal gate 147 may be simultaneously flattened through a planarization process, thereby yielding coplanar top surfaces.

In exemplary embodiments in accordance with principles of inventive concepts, first spacer structure 120 may include first through $n^{th}$ spacers 121, 122a, 122b, and 123 that are sequentially stacked, where, n denotes natural number greater than or equal to "2".

Although it will be described below, in exemplary embodiments in accordance with principles of inventive concepts, the first spacer 121 may be used to protect the top surface of the substrate (or the first fin F1) 100 before doping a low doped drain (LDD) region. The first spacer 121 may include, for example, SiN, and may be formed using, for example, an atomic layer deposition (ALD) scheme. The first spacer 121 may be conformally formed along the sidewall of the first metal gate 147 and the top surface of the first fin F1, for example.

The second spacers 122a and 122b may be used to form a trench within a fin in order to form a source and a drain of another transistor (for example, a regular, that is, non-fin-transistor having lower operating voltage than a high voltage transistor). The second spacers 122a and 122b may include multiple layers of insulating layers. For example, the second spacer 122a may be SiOCN and the second spacer 122b may be an oxide layer. The second spacers 122a and 122b may be conformally formed on the first spacer 121 along the sidewall of the first metal gate 147 and the top surface of the first fin F1.

The third spacer 123 may include, for example, SiOCN, and may be formed after forming an elevated source/drain of another transistor. The third spacer 123 may be conformally formed on the second spacers 122a and 122b along the sidewall of the first metal gate 147 and the top surface of the first fin F1.

Materials and fabricating methods of the first spacer 121 through the third spacer 123 are only exemplary embodiments in accordance with principles of inventive concepts and inventive concepts are not limited thereto. In exemplary embodiments in accordance with principles of inventive concepts, although the first spacer structure 120 is illustrated to be formed by stacking four material layers, inventive concepts are not limited thereto. For example, the first spacer structure 120 may be three layers or less, and may be five layers or more.

As illustrated in the exemplary embodiments of FIGS. 1-3, each of the first through $n^{th}$ spacers 121, 122a, 122b, and 123 may be provided in an "L" shape. In exemplary embodiments in accordance with principles of inventive concepts, the $n^{th}$ spacer (for example, the third spacer 123 of FIG. 3), disposed at an outermost portion in the first spacer structure 120, may be provided in an L shape. In exemplary embodiments in accordance with principles of inventive concepts, even though another spacer disposed below the $n^{th}$ spacer 123 is not provided in an L shape, the $n^{th}$ spacer 123 may be provided in the L shape.

In this exemplary embodiment in accordance with principles of inventive concepts, the first spacer structure 120 may directly contact the interlayer insulating layers 171, 172 and 173. The interlayer insulating layers 171, 172, and 173 may directly contact the sidewall of the first portion 120a and the top surface of the second portion 120b of the first spacer structure 120. In addition, the interlayer insulating layers 171, 172, and 173 may also directly contact a portion of the sidewall of the second portion 120b.

In exemplary embodiments in accordance with principles of inventive concepts, interlayer insulating layers 171, 172, and 173 may include, for example, a plurality of stacked insulating layers. For example, a passivation layer 171 may be formed along the side surface of the first spacer structure 120 and the top surface of the first elevated source/drain 161 and 162. The passivation layer 171 may be, for example, SiN, but inventive concepts are not limited thereto. The passivation layer 171 protects the first elevated source/drain 161 and 162 and the first metal gate 147 during a subsequent process of forming an insulating layer 172. The insulating layer 172 may be, for example, a furnace chemical vapor deposition (FCVD) layer, and an insulating layer 173 may be, for example, a high density plasma chemical vapor deposition (HDP) layer. The insulating layer 172 may seal the first elevated source/drain 161 and 162 and the first metal gate 147, and the insulating layer 173 may be harder than the insulating layer 172. An LDD region 181 may be disposed in a lower portion of the first spacer structure 120.

In exemplary embodiments in accordance with principles of inventive concepts, a spacer structure distances elevated source/drain structures (for example, first source/drain structures 161 and 162) from a metal gate (for example, first metal gate 147) in order to reduce gate induced drain leakage (GIDL) current and, thereby, improve performance of a high voltage transistor in accordance with principles of inventive concepts. GIDL current can be particularly problematic in high voltage transistors and exemplary embodiments in accordance with principles of inventive concepts are particularly useful in high voltage transistor structures. In exemplary embodiments, an L-shaped spacer is employed to extend the distance between source/drain structures and metal gate. In exemplary embodiments, the lower leg, the "horizontal" component of the L-shaped spacer 120 (for example, second portion 120b of the spacer structure 120) extends the distance L1 between metal gate 147 and source/drain regions 161/162 beyond the thickness of first portion 120a of spacer structure 120. In accordance with principles of inventive concepts, an L-shaped spacer structure, such as structure 120 may be formed without requiring an additional mask, thereby improving performance while avoiding increased costs of production. Semiconductor device 1 may be formed within an input/output (I/O) circuit, for example.

Figure 4:
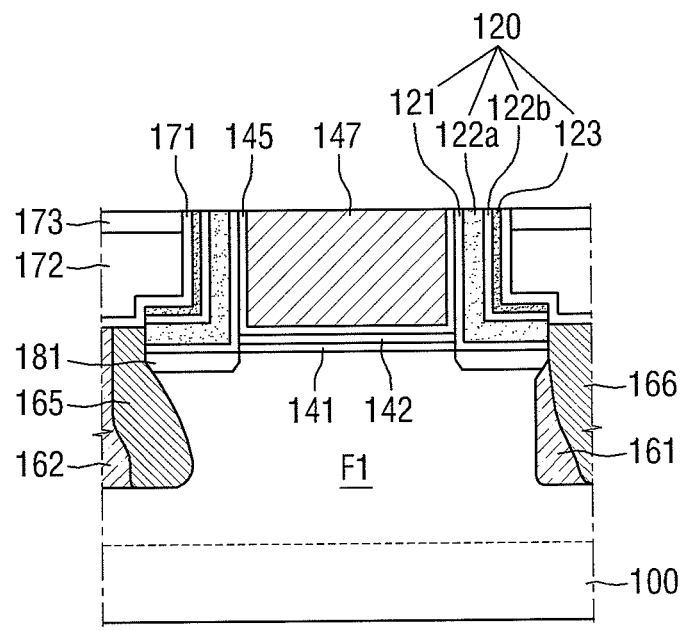
FIG. 4 is a cross-sectional view to describe a semiconductor device 2 according to a second exemplary embodiment in accordance with principles of inventive concepts.

FIG. 4 is a cross-sectional view of a semiconductor device 2 according to a second exemplary embodiment in accordance with principles of inventive concepts. For clarity and conciseness, description of this exemplary embodiment will focus on the differences between this exemplary embodiment and that of semiconductor device 1 described above with reference to FIGS. 1 to 3.

Semiconductor device 2 may include a first plug dopant region 165 and a second plug dopant region 166 in addition to the L-shaped first spacer structure 120. The first plug dopant region 165 may be disposed on a side of the first elevated source 162 and the second plug dopant region 166 may be disposed on a side of the first elevated drain 161. The first plug dopant region 165 and the second plug dopant region 166 are formed in order to adjust resistance of the first elevated source/drain 161 and 162. That is, although the first elevated source/drain 161 and 162 are formed using an epitaxial growth together with in-situ doping, the first plug dopant region 165 and the second plug dopant region 166 may be formed in order to more precisely adjust the resistance of the first elevated source/drain 161 and 162.

The first plug dopant region 165 and the second plug dopant region 166 may be formed through a tilted implant process. For example, "P (phosphorus)" may be doped and may be implanted by applying a tilt of about 20 degrees from a plane vertical to the substrate 100. First plug dopant region 165 may be formed to extend to an inside of the first elevated source 162 and a lower portion of the first spacer structure 120. The second plug dopant region 166 may be formed within the first elevated drain 161. In exemplary embodiments in accordance with principles of inventive concepts, the second plug dopant region 166 may be formed to not overlap with the first spacer structure 120.

High voltage (for example, 1.5V or more) may be applied to the first elevated drain 161, and relatively low voltage (for example, 0V or less) may be applied to the first elevated source 162. As previously described, an area in which GIDL current generally occurs is between the first elevated drain 161 and the first metal gate 147 and, because, in this exemplary embodiment, the second plug dopant region 166 is distanced from the first metal gate 147, GIDL current may be reduced in accordance with principles of inventive concepts.

Figure 5:
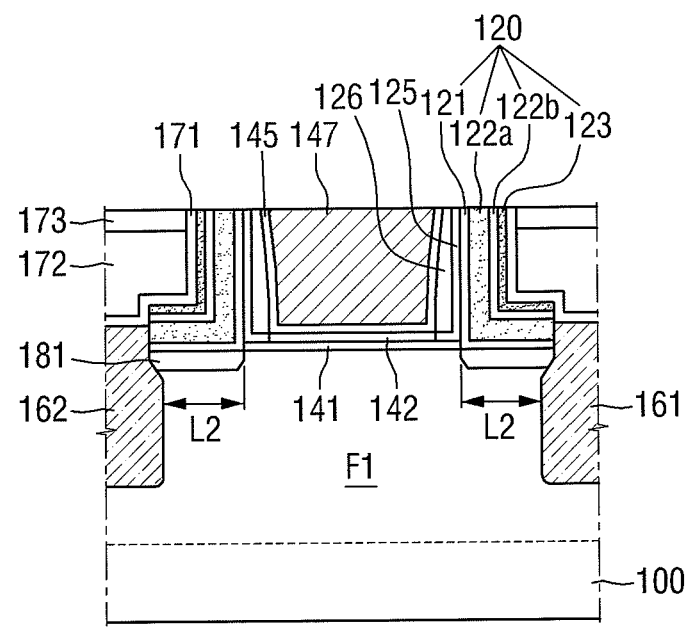
FIG. 5 is a cross-sectional view to describe a semiconductor device 3 according to a third exemplary embodiment in accordance with principles of inventive concepts.

FIG. 5 is a cross-sectional view of a semiconductor device 3 according to a third exemplary embodiment in accordance with principles of inventive concepts. For clarity and conciseness, description of this exemplary embodiment will focus on differences between this exemplary embodiment and that of semiconductor device 1 described above with reference to FIGS. 1 to 3.

Semiconductor device 3 may include inner spacers 125 and 126 disposed between the first metal gate 147 and the first spacer structure 120. The inner spacers 125 and 126 may be, for example, an oxide layer 125 and a low dielectric layer 126, for example. The low dielectric layer 126 may include SiOCN, for example.

One or both of inner spacers 125 and 126 may be provided as a chamfered "I-shaped" spacer (that is, I-shaped in the sense of having two vertical parallel sides, before chamfering). In exemplary embodiments in accordance with principles of inventive concepts, upper portions of the inner spacers 125 and 126 are adjacent to an upper portion of the first metal gate 147 and have a first combined width, and lower portions of the inner spacers 125 and 126 are adjacent to a lower portion of the first metal gate 147 and have a second combined width different from the first width. In exemplary embodiments in accordance with principles of inventive concepts, the first width is less than the second width. Additionally, the L-shaped first spacer structure 120 may be non-chamfered.

The distance L2 between the first metal gate 147 and the first elevated drain 161 may be extended by the inner spacers 125 and 126. That is, the distance L2 between the first metal gate 147 and the first elevated drain 161 in the semiconductor device 3 according to the third exemplary embodiment in accordance with inventive concepts may be greater than the distance L1 between the first metal gate 147 and the first elevated drain 161 in the semiconductor device 1 according to the first exemplary embodiment in accordance with principles of inventive concepts. Such an exemplary embodiment may further reduce the occurrence of GIDL current.

In accordance with principles of inventive concepts, among the first gate insulating layers 141, 142, and 145, the sacrificial insulating layer 141 may be positioned below the inner spacers 125 and 126. The interface layer 142 may be positioned between the inner spacers 125 and 126. The high dielectric layer 145 may be conformally formed along the sidewall of the inner spacers 125 and 126 and the top surface of the insulating layer 141.

Figure 6:
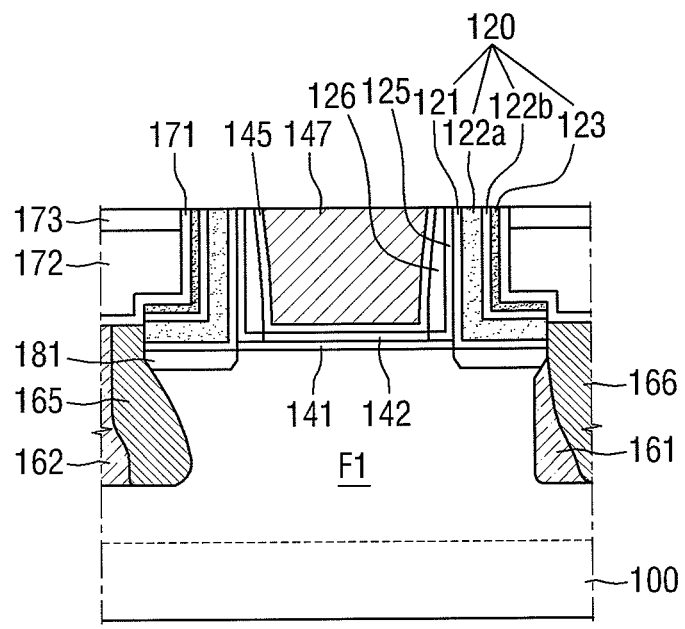
FIG. 6 is a cross-sectional view to describe a semiconductor device 4 according to a fourth exemplary embodiment in accordance with principles of inventive concepts.

FIG. 6 is a cross-sectional view of a semiconductor device 4 according to a fourth exemplary embodiment in accordance with principles of inventive concepts. For clarity and conciseness, description of this exemplary embodiment will focus on differences between this exemplary embodiment and those of semiconductor devices 1, 2, and 3 described above with reference to FIGS. 1 to 5.

Semiconductor device 4 according to the fourth exemplary embodiment may include first and second plug dopant regions 165 and 166 formed through a tilted implant process, and inner spacers 125 and 126 disposed between the first spacer structure 120 and the first metal gate 147. Because semiconductor device 4 includes the L-shaped spacer structure 120, the first and second plug dopant regions 165 and 166, and the inner spacers 125 and 126, it is possible to minimize the occurrence of GIDL current.

Figure 7:
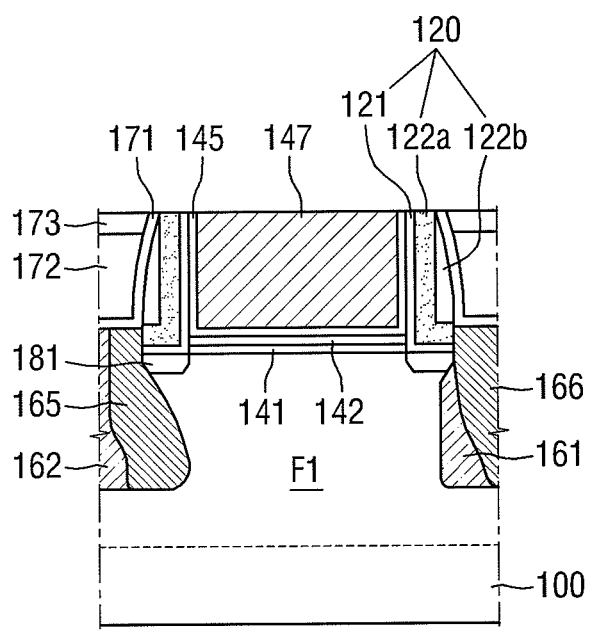
FIG. 7 is a cross-sectional view to describe a semiconductor device 5 according to a fifth exemplary embodiment in accordance with principles of inventive concepts.
Figure 8:
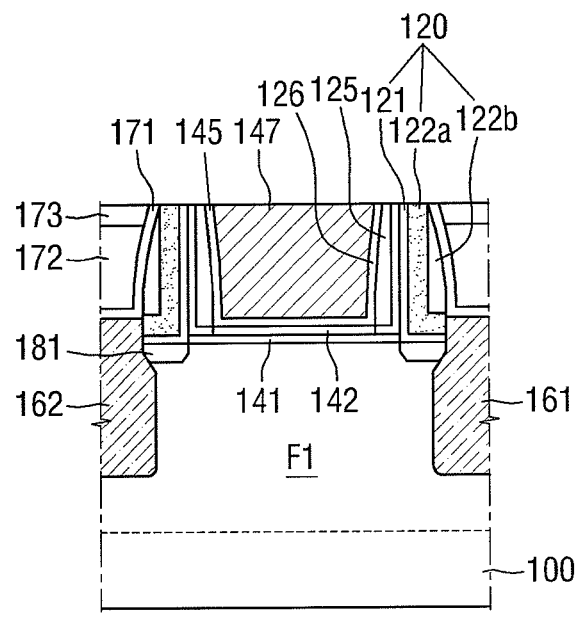
FIG. 8 is a cross-sectional view to describe a semiconductor device 6 according to a sixth exemplary embodiment in accordance with principles of inventive concepts.

FIG. 7 is a cross-sectional view of a semiconductor device 5 according to a fifth exemplary embodiment in accordance with principles of inventive concepts. FIG. 8 is a cross-sectional view of a semiconductor device 6 according to a sixth exemplary embodiment in accordance with principles of inventive concepts.

Referring to FIG. 7, the semiconductor device 5 according to a fifth exemplary embodiment may not adopt the L-shaped first spacer structure 120, but may adopt the first plug dopant region 165 and the second plug dopant region 166, for example.

Referring to FIG. 8, the semiconductor device 6 according to a sixth exemplary embodiment may not employ the L-shaped first spacer structure 120, but may adopt the inner spacers 125 and 126 disposed between the first spacer structure 120 and the first metal gate 147, for example.

That is, in FIGS. 7 and 8, the first spacer structure 120 may be provided in a chamfered I shape, not the L shape. Nevertheless, even without the second portion 120b of spacer structure 120, the distance between first elevated drain 161 and the first metal gate 147 may be extended (by, inner spacers 125, 126 or first and second plug dopant regions 165, 166) and in this way GIDL current may be reduced.

Figure 9A:
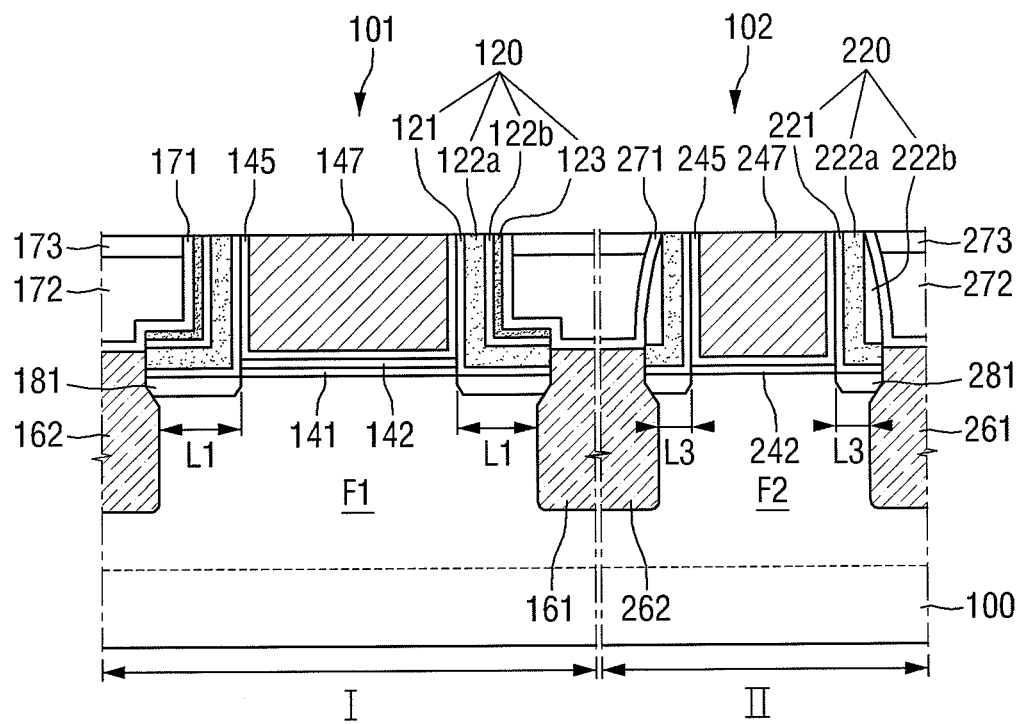
FIG. 9A is a cross-sectional view to describe a semiconductor device 7 according to a seventh exemplary embodiment in accordance with principles of inventive concepts.

FIG. 9A is a cross-sectional view of a semiconductor device 7 according to a seventh exemplary embodiment in accordance with principles of inventive concepts. In semiconductor device 7, a first region I and a second region II are defined within the substrate 100. A first transistor 101 configured to operate with first driving voltage may be formed on the first region I, and a second transistor 102 configured to operate with second driving voltage different from the first driving voltage may be formed on the second region II. In this exemplary embodiment, the second driving voltage may be less than the first driving voltage. For example, the second driving voltage may be regular voltage (for example, between 0V and 1.5V) and the first driving voltage may be high voltage.

The first region I may be disposed within, for example, an I/O circuit, and the second region II may be disposed within, for example, a core circuit. The first transistor 101 and the second transistor 102 may be the same conductive type (for example, N-type) transistors.

The first transistor 101 may be any one of the transistors described above with reference to FIGS. 1 to 8. For example, FIG. 9A illustrates the transistor of FIG. 3. The first transistor 101 may include the first metal gate 147 and the L-shaped first spacer structure 120 formed on both sides of the first metal gate 147, for example and the first metal gate 147 may be formed to traverse the first fin F1. Due to the L-shaped first spacer structure 120, the first distance L1 between the first metal gate 147 and each of the first elevated source/drain 161 and 162 may be increased.

The second transistor 102 may include a second metal gate 247, a second spacer structure 220 formed on both sides of the second metal gate 247, and second elevated source/ drain 261 and 262. In this exemplary embodiment, the second spacer structure 220 may be provided in a chamfered I shape. Accordingly, a third distance L3 between the second metal gate 247 and each of the second elevated source/drain 261 and 262 may be less than the first distance L1.

The second spacer structure 220 may include a plurality of stacked spacers 221, 222a, and 222b.

Among second gate insulating layers 242 and 245, an interface layer 242 may be a silicon oxide layer and a high dielectric layer 245 may be a high dielectric (high-k) material having a high dielectric constant than the silicon oxide layer. The high dielectric layer 245 may be conformally formed along a sidewall and a bottom surface of the second metal gate 247.

The thickness of the second gate insulating layers 242 and 245 may be less than the thickness of the first gate insulating layers 141, 142, and 145 because, in this exemplary embodiment, driving voltage of the second transistor 102 is relatively small compared to driving voltage of the first transistor 101.

Figure 9B:
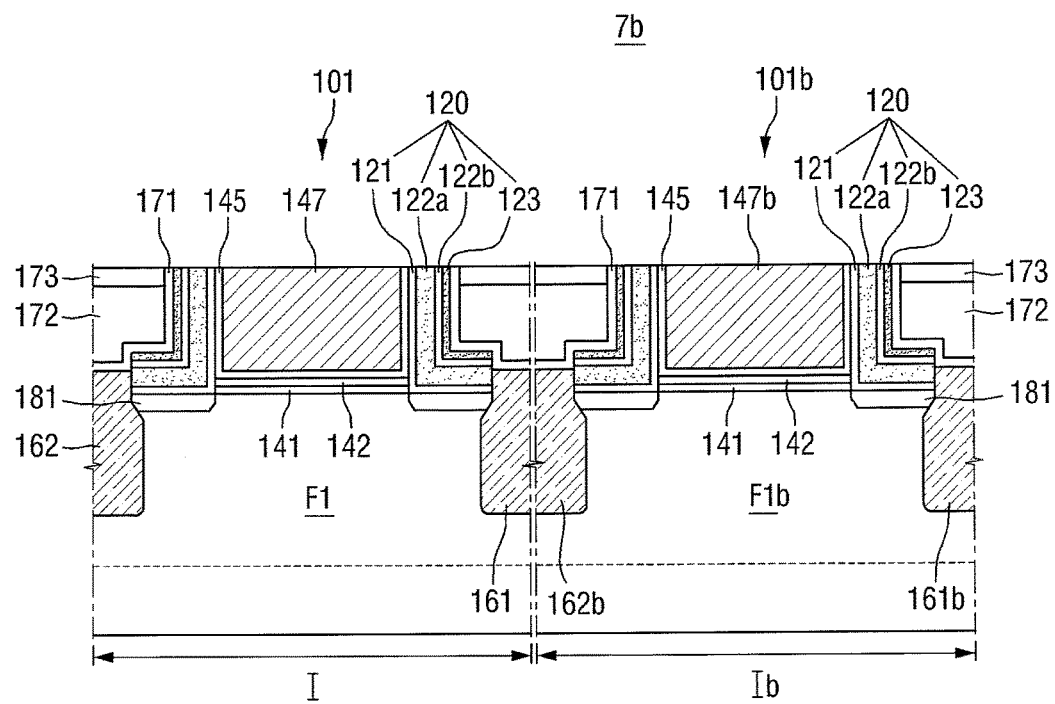
FIG. 9B is a cross-sectional view to describe a semiconductor device 7b according to a 7b$^{th}$ exemplary embodiment in accordance with principles of inventive concepts.

FIG. 9B is a cross-sectional view of a semiconductor device 7b according to a 7b$^{th}$ exemplary embodiment in accordance with principles of inventive concepts. In the semiconductor device 7b according to the 7b$^{th}$ exemplary embodiment, a first region I and a 1b$^{th}$ region Ib are defined within the substrate 100. A first conductive type, for example, an N-type first transistor 101 configured to be driven at high voltage is formed on the first region I, and a second conductive type, for example, a P-type 1b$^{th}$ transistor 101b configured to be driven at high voltage may be formed on the 1b$^{th}$ region 1b. The first region I and the 1b$^{th}$ region Ib may be disposed in, for example, an I/O circuit, but inventive concepts are not limited thereto.

The first metal gate 147 of the first transistor 101 may include, for example, an N-type work function adjusting layer. The N-type work function adjusting layer may be, for example, a material selected from a group including TiAl, TiAlC, TiAlN, TaC, TiC, and HfSi, but the present inventive concept is not limited thereto.

A 1b$^{th}$ metal gate 147b of the 1b$^{th}$ transistor 101b may include, for example, a P-type work function adjusting layer, or may include stacked layers of a P-type work function adjusting layer and an N-type work function adjusting layer. In accordance with principles of inventive concepts, the 1b$^{th}$ metal gate 147b may include all of the P-type work function adjusting layer and the N-type work function adjusting layer in order to simplify the production process. The P-type work function adjusting layer may be TiN, for example.

The first elevated source/drain 161 and 162 of the first transistor 101 may include a tensile stress material, and elevated source/drain 161b and 162b of the 1b$^{th}$ transistor 101b may include a compression stress material.

Figure 10:
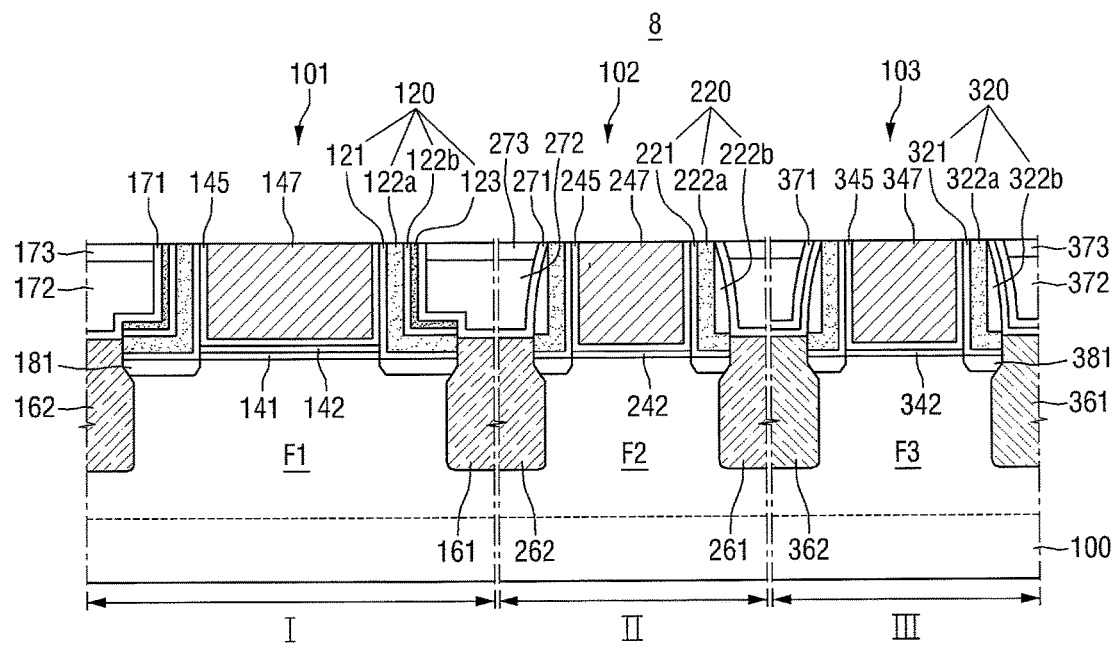
FIG. 10 is a cross-sectional view to describe a semiconductor device 8 according to an eighth exemplary embodiment in accordance with principles of inventive concepts.

FIG. 10 is a cross-sectional view to of a semiconductor device 8 according to an eighth exemplary embodiment in accordance with principles of inventive concepts. For conciseness and clarity of description, the description will focus on differences between this exemplary embodiment and that of semiconductor device 7 described above with reference to FIG. 9A.

In semiconductor device 8, a first region I, a second region II, and a third region III are defined within the substrate 100. A high voltage first conductive type, for example, N-type first transistor 101 is formed in the first region I, a regular voltage first conductive type second transistor 102 is formed in the second region II, and a regular voltage second conductive type, for example, P-type third transistor 103 may be formed in the third region III.

In this exemplary embodiment in accordance with principles of inventive concepts, first transistor 101 and the second transistor 102 of FIG. 10 are the same as the first transistor 101 and the second transistor 102 of FIG. 9A. The third transistor 103 may include a third metal gate 347, a third spacer structure 320 formed on both sides of the third metal gate 347, and third elevated source/drain 361 and 362. The third spacer structure 320 may be provided in a chamfered I shape.

Figure 11:
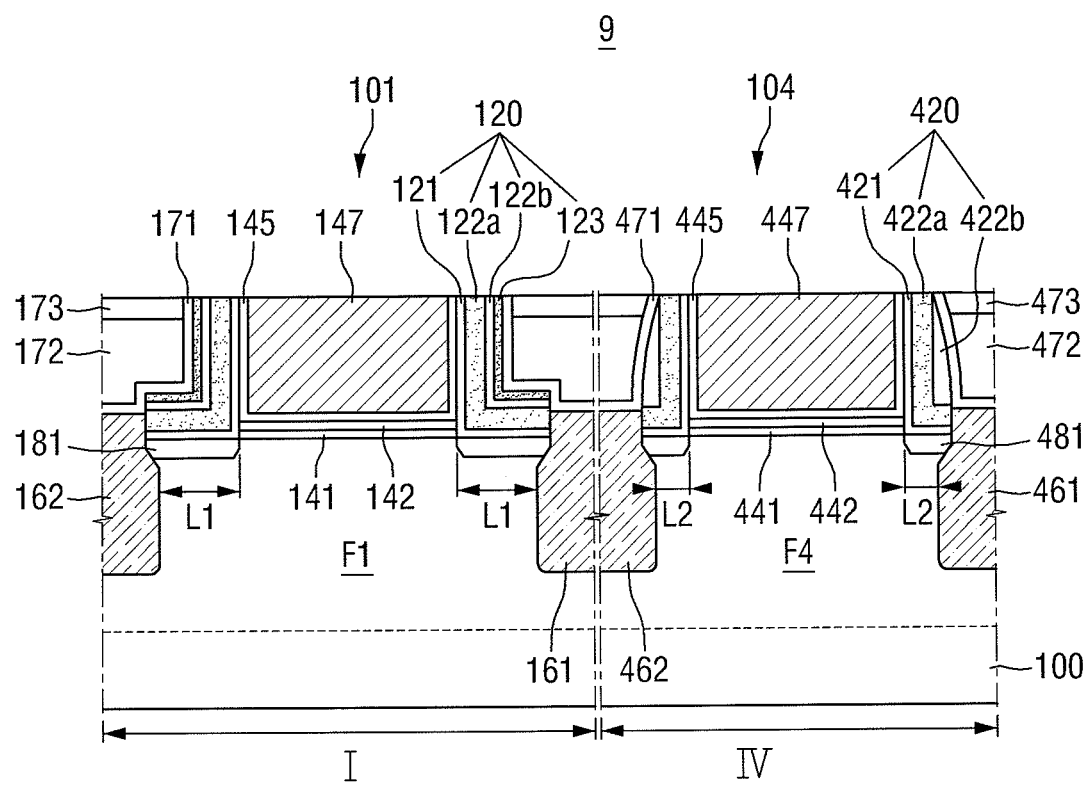
FIG. 11 is a cross-sectional view to describe a semiconductor device 9 according to a ninth exemplary embodiment in accordance with principles of inventive concepts.

FIG. 11 is a cross-sectional of a semiconductor device 9 according to a ninth exemplary embodiment in accordance with principles of inventive concepts.

In the semiconductor device 9, a first region I and a fourth region IV are defined within the substrate 100. The first transistor 101 may be formed in the first region I, and the first transistor 101 may be any one of the transistors 101 described above with reference to FIGS. 1 to 8. A fourth transistor 104 may be formed in the fourth region IV, and may include a fourth metal gate 447, a chamfered I-shaped fourth spacer structure 420 formed on both sides of the fourth metal gate 447, and fourth elevated source/drain 461 and 462. The fourth spacer structure 420 may include a plurality of stacked spacers 421, 422a, and 422b. Also, among fourth gate insulating layers 441, 442, and 445, a sacrificial insulating layer 441 and an interface layer 442 may be silicon oxide layers, and a high dielectric layer 445 may be a high dielectric (high-k) material having a dielectric constant higher than the silicon oxide layer.

The first transistor 101 and the fourth transistor 104 may be high voltage transistors, and the first region I and the fourth region IV may be disposed within an I/O circuit. That is, in the semiconductor device 9, the high voltage first transistor 101 to which the L-shaped first spacer structure 120 is applied and the high voltage fourth transistor 104 to which the I-shaped fourth spacer structure 420 is applied may be simultaneously configured.

Figure 12:
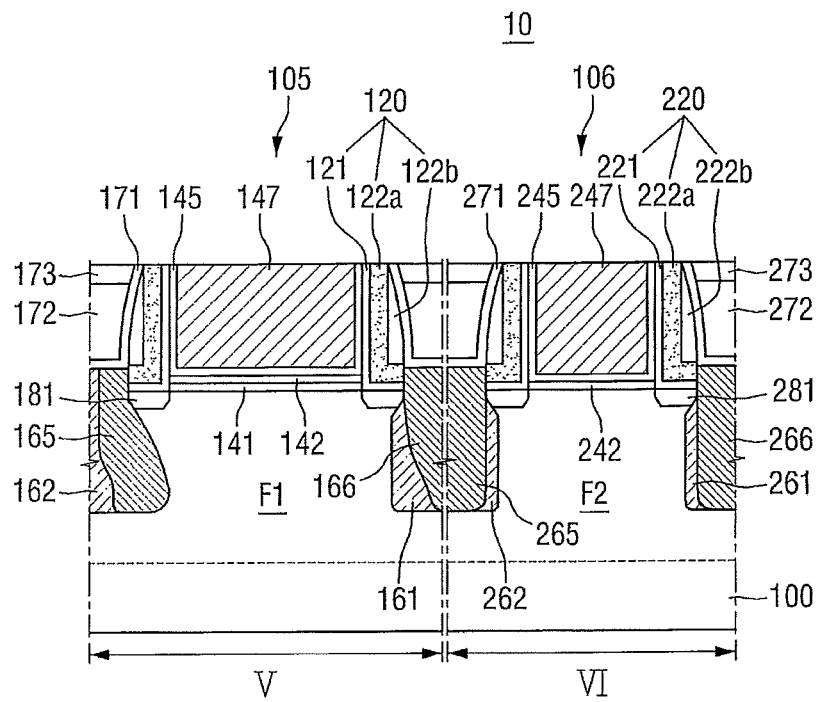
FIG. 12 is a cross-sectional view to describe a semiconductor device 10 according to a tenth exemplary embodiment in accordance with principles of inventive concepts.

FIG. 12 is a cross-sectional view of a semiconductor device 10 according to a tenth exemplary embodiment in accordance with principles of inventive concepts. In the semiconductor device 10, a fifth region V and a sixth region VI are defined within the substrate 100.

A fifth transistor 105 formed in the fifth region V may be a high voltage transistor. As described above with reference to FIG. 7, the fifth transistor 105 may not adopt an L-shaped spacer structure and may adopt only the tilted first plug dopant region 165 and the second plug dopant region 166, for example, in order to diminish the occurrence of GIDL current.

A sixth transistor 106 formed on the sixth region VI may be a regular transistor. The sixth transistor 106 may include a third plug dopant region 265 and a fourth plug dopant region 266. The third plug dopant region 265 may be disposed on a side of a sixth elevated source 262, and the fourth plug dopant region 266 may be disposed on a side of a sixth elevated drain 261. The first plug dopant region 165 and the second plug dopant region 166 may be tilted, whereas the third plug dopant region 265 and the fourth plug dopant region 266 may be un-tilted. Accordingly, the distance from the third plug dopant region 265 to the sixth metal gate 247 may be substantially identical to a distance from the fourth plug dopant region 266 to the sixth metal gate 247.

Figure 13A:
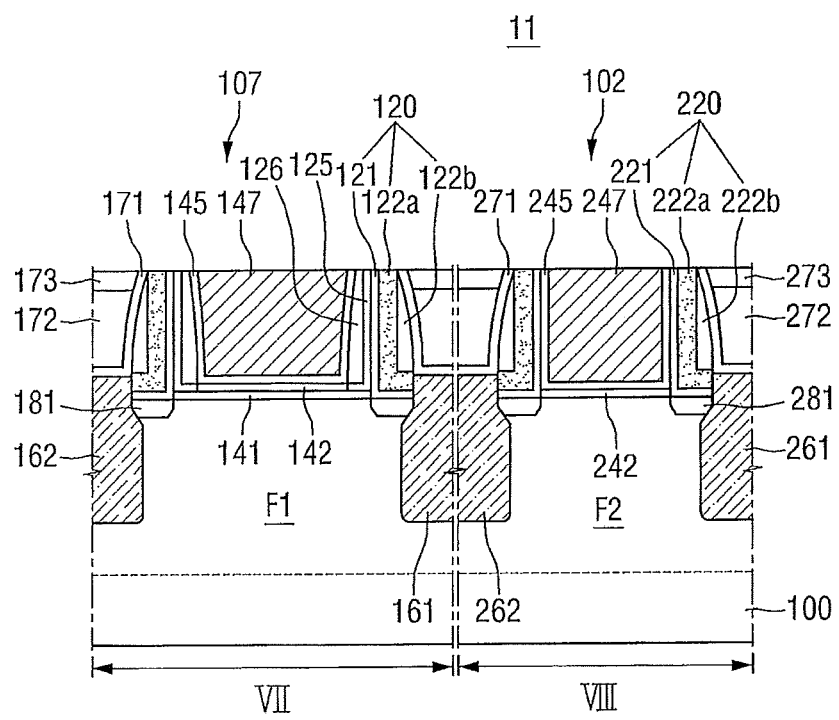
FIG. 13A is a cross-sectional view to describe a semiconductor device 11 according to an eleventh exemplary embodiment in accordance with principles of inventive concepts.

FIG. 13A is a cross-sectional view of a semiconductor device 11 according to an eleventh exemplary embodiment in accordance with principles of inventive concepts. In the semiconductor device 11, a seventh region VII and an eighth region VIII are defined within the substrate 100.

A seventh transistor 107 formed in the seventh region VII may be a high voltage transistor. As described above with reference to FIG. 8, the seventh transistor 107 may not adopt an L-shaped spacer structure, but may adopt the inner spacers 125 and 126 disposed between the first spacer structure 120 and the first metal gate 147 to reduce the occurrence of GIDL current.

The second transistor 102 of FIG. 9A formed on the eighth region VIII may be a regular transistor. The second transistor 102 may include the second metal gate 247, the second spacer structure 220 formed on both sides of the second metal gate 247, and the second elevated source/drain 261 and 262. In this exemplary embodiment, the second spacer structure 220 may be provided in a chamfered I shape. That is, the high voltage seventh transistor 107 that includes the inner spacers 125 and 126 and the regular voltage second transistor 102 that does not include an inner spacer may be formed on a single wafer.

Figure 13B:
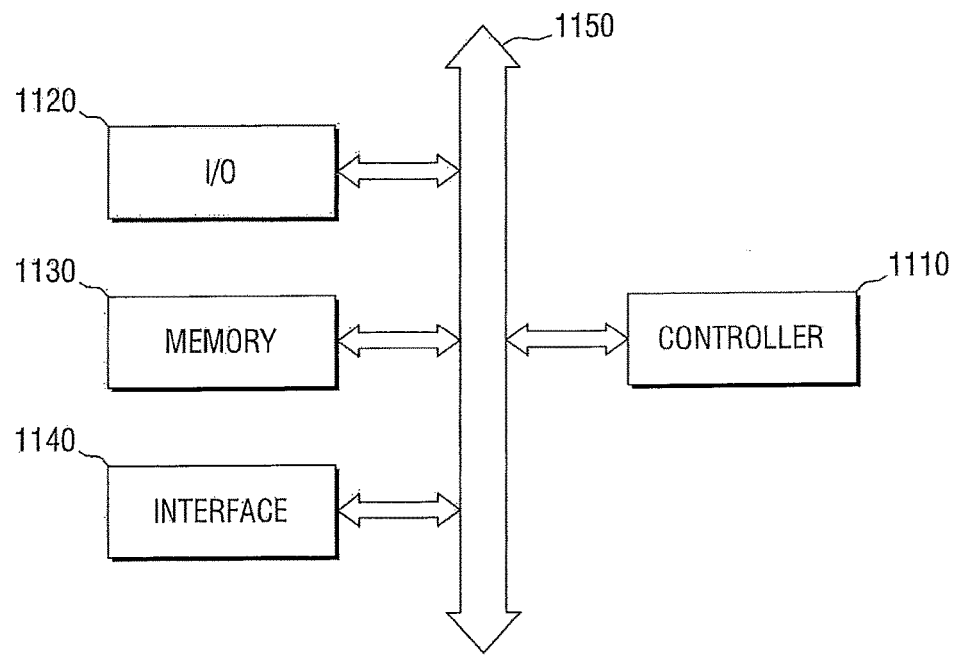
FIG. 13B is a block diagram of an electronic system 1100 including a semiconductor device according to a few embodiments of the present inventive concept.

FIG. 13B is a block diagram of an electronic system 1100 including a semiconductor device in accordance with principles of inventive concepts. The electronic system 1100 may include a controller 1110, an I/O device 1120, a memory device 1130, an interface 1140, and a bus 1150. The controller 1110, the I/O device 1120, the memory device 1130, and/or the interface 1140 may be combined, or communicate, with each other via the bus 1150. A semiconductor device in accordance with principles of inventive concepts may be employed in any of the listed devices.

The controller 1110 may include at least one of a microprocessor, a digital signal processor, a microcontroller, and logic elements capable of performing a function similar thereto. The I/O device 1120 may include a keypad, a keyboard, and a display device. The memory device 1130 may store data and/or an instruction. The interface 1140 may serve to transmit data to a communication network or receive data from the communication network. The interface 1140 may be provided in a wired or wireless form. For example, the interface 1140 may include an antenna or a wired/wireless transceiver. Although not illustrated, the electronic system 1100 may further include a high speed DRAM and/or SRAM as an operating memory to improve an operation of the controller 1110. A fin field effect transistor may be provided within the memory device 1130 or may be provided as a portion of the controller 1110 and the I/O device 1120.

The electronic system 1100 may be applied to a portable electronic device such as a personal digital assistant (PDA), a portable computer, a web tablet, a wireless phone, a mobile phone, a digital music player, a memory card, or any type of electronic product capable of transmitting and/or receiving information in a wireless environment.

Hereinafter, an exemplary fabricating method of the semiconductor device 8 according to the eighth exemplary embodiment in accordance with principles of inventive concepts will be described with reference to FIG. 10 and FIGS. 14 to 23. FIGS. 14 to 23 are cross-sectional views illustrating intermediate operations to describe the fabricating method of the semiconductor device 8 according to the eighth embodiment in accordance with principles of inventive concepts.

Figure 14:
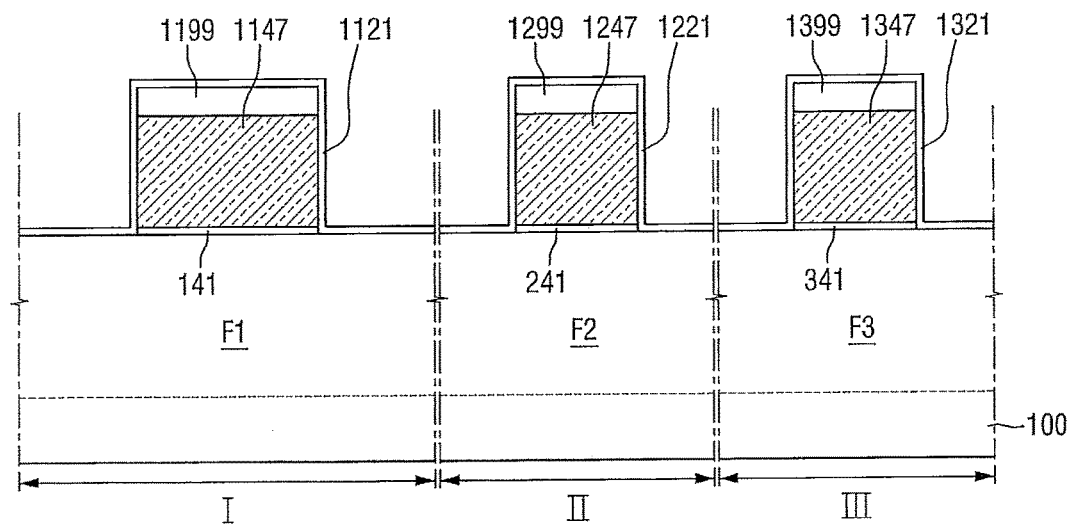
FIGS. 14 to 23 are cross-sectional views illustrating intermediate operations to describe the fabricating method of the semiconductor device 8 according to the eighth exemplary embodiment in accordance with principles of inventive concepts.

Referring to FIG. 14, the first region I, the second region II, and the third region III are defined within the substrate 100. The first region I is a region in which the high voltage first conductive type, for example, N-type first transistor 101 is to be formed, the second region II is a region in which the regular voltage first conductive type second transistor 102 is to be formed, and the third region III is a region in which the regular voltage second conductive type, for example, P-type third transistor 103 is to be formed.

The first fin F1, a second fin F2, and a third fin F3 may be formed in the first region I, the second region II, and the third region III, respectively.

A first sacrificial gate 1147, a second sacrificial gate 1247, and a third sacrificial gate 1347 may be formed to traverse the first fin F1, the second fin F2, and the third fin F3, respectively. The first sacrificial gate 1147 through the third sacrificial gate 1347 may be, for example, poly silicon.

First through third hard masks 1199, 1299, and 1399 may be formed on the first sacrificial gate 1147, the second sacrificial gate 1247, and the third sacrificial gate 1347, respectively.

The sacrificial insulating layer 141 may be formed between the first sacrificial gate 1147 and the first fin F1, the sacrificial insulating layer 241 may be formed between the second sacrificial gate 1247 and the second fin F2, and the sacrificial insulating layer 341 may be formed between the third sacrificial gate 1347 and the third fin F3.

A spacer insulating layer 1121 may be formed on the first sacrificial gate 1147, the first hard mask 1199, and the first fin F1, a spacer insulating layer 1221 may be formed on the second sacrificial gate 1247, the second hard mask 1299, and the second fin F2, and a spacer insulating layer 1321 may be formed on the third sacrificial gate 1347, the third hard mask 1399, and the third fin F3.

Figure 15:
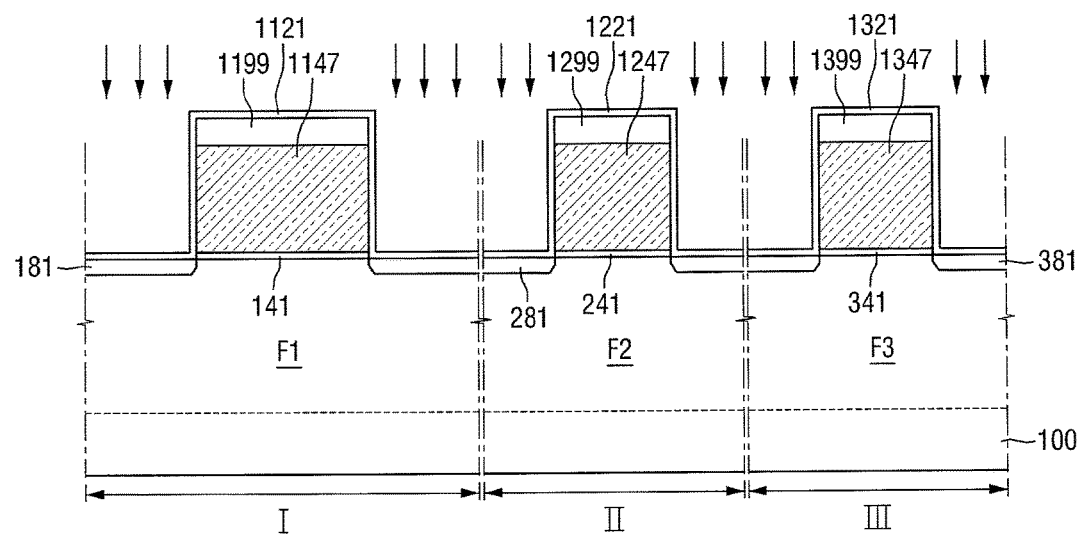

Next, referring to FIG. 15, the LDD region 181 of the first transistor 101 and an LDD region 281 of the second transistor 102 may be formed by implanting first conductive type (for example, N-type) LDD impurities. For example, N-type impurities may be As.

Next, an LDD region 381 of the third transistor 103 may be formed by implanting second conductive type (for example, P-type) LDD impurities. For example, P-type impurities may be BF2.

Figure 16:
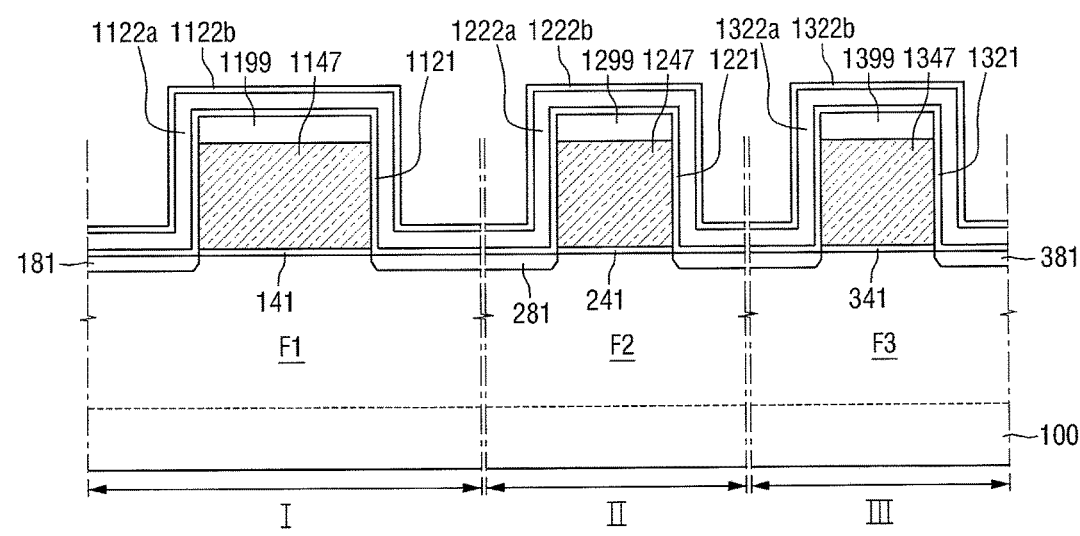

Next, referring to FIG. 16, spacer insulating layers 1122*a* and 1122*b*, 1222*a* and 1222*b*, and 1322*a* and 1322*b* are further formed on the result of FIG. 15. The spacer insulating layers 1122*b*, 1222*b*, and 1322*b* may be conformally formed along the spacer insulating layers 1122*a*, 1222*a*, and 1322*a*. In this exemplary embodiment in accordance with principles of inventive concepts, the spacer insulating layers 1122*a* and 1122*b*, 1222*a* and 1222*b*, and 1322*a* and 1322*b* may be, for example, two layers, and stacked layers of SiOCN and an oxide layer.

Figure 17:
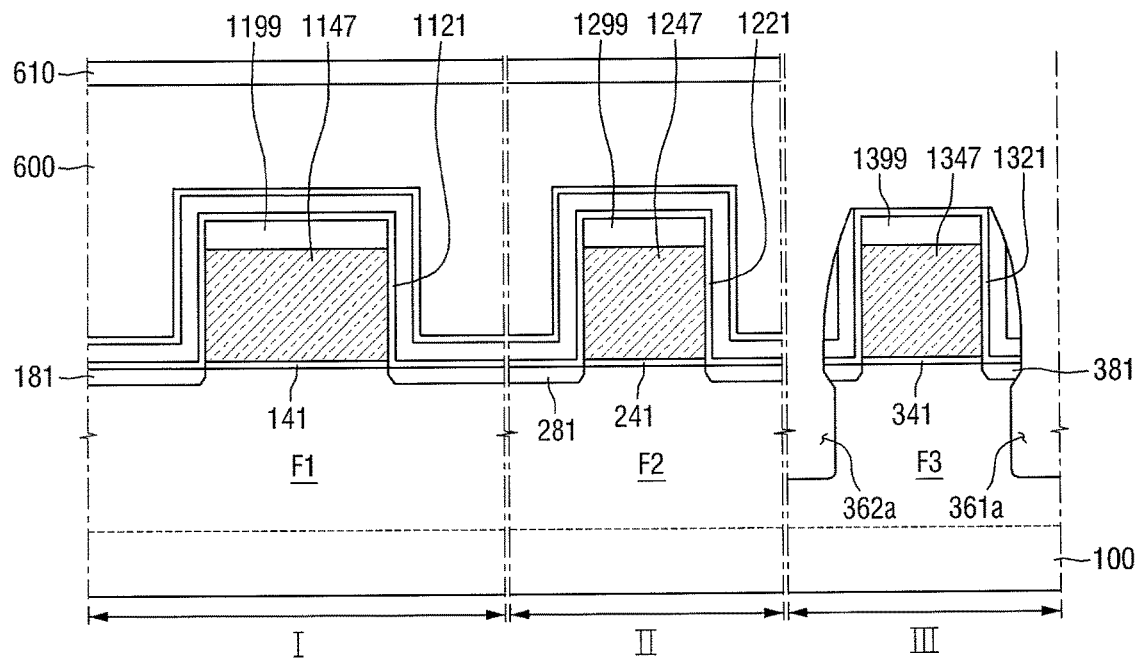

Next, referring to FIG. 17, mask patterns 600 and 610 configured to expose the third region III and to cover the first region I and the second region II may be formed on the result of FIG. 16. The mask patterns 600 and 610 may be, for example, two layers. That is, an H—SOH 600 may be formed to sufficiently cover the first region I and the second region II, and the oxide layer 610 may be formed on the H—SOH 600 using an ALD scheme.

Trenches 361*a* and 362*a* may be formed around the third metal gate 347 of the third region III using the mask patterns 600 and 610, and using, for example, a dry etching. While forming the trenches 361*a* and 362*a*, the spacer insulating layers 1322*a* and 1322*b* may be etched and be provided in a chamfered I shape.

Figure 18:
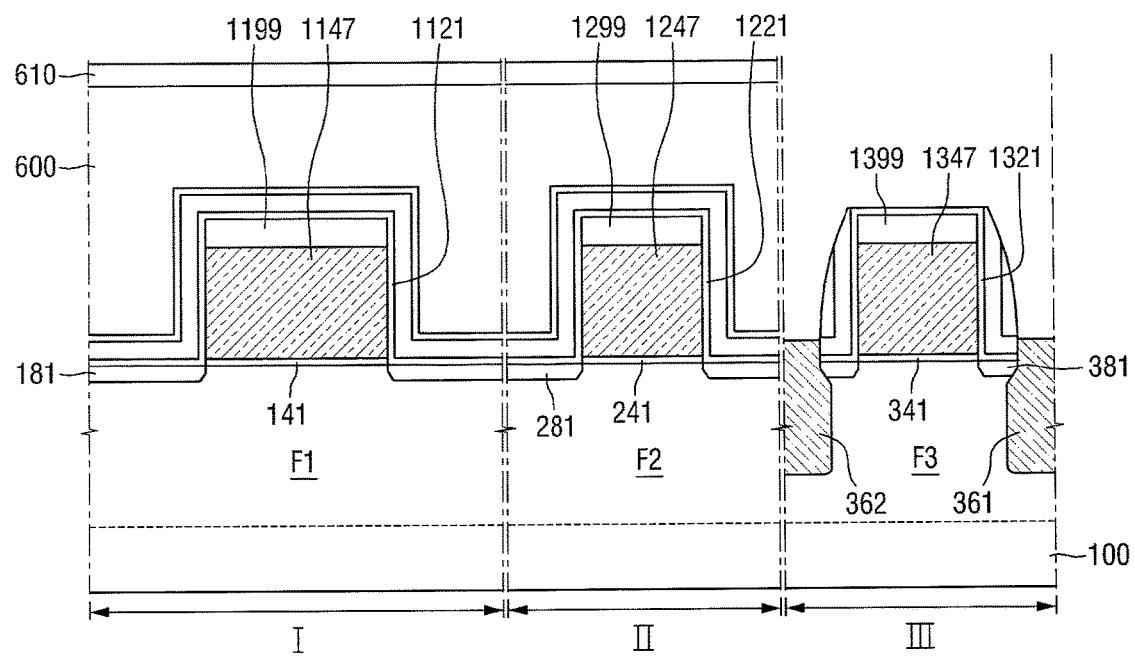

Next, referring to FIG. 18, the third elevated source/drain 361 and 362 may be formed within the trenches 361*a* and 362*a* of the third region III. The third elevated source/drain 361 and 362 may be formed using, for example, an epitaxial growth scheme and may be in-situ doped with, for example, P-type impurities. The third elevated source/drain 361 and 362 may be grown to be protruded upward from the third fin F3.

Figure 19:
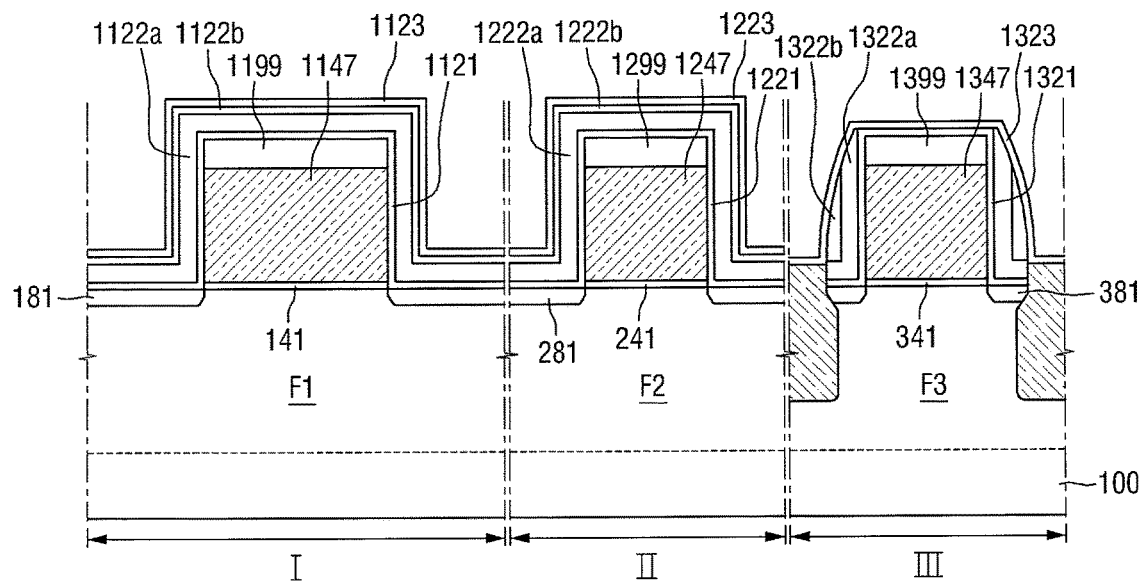

Next, referring to FIG. 19, spacer insulating layers 1123, 1223, and 1323 may be formed on the result of FIG. 18. The spacer insulating layers 1123, 1223, and 1323 may be, for example, SiOCN. In this exemplary embodiment in accordance with principles of inventive concepts, in the first region I and the second region II, the spacer insulating layers 1123 and 1223 are conformally formed on the spacer insulating layers 1122b and 1222b. Additionally, in the third region III, the spacer insulating layer 1323 may be conformally formed on the top surface of the third elevated source/drain 361 and 362 and the chamfered I-shaped spacer.

Figure 20:
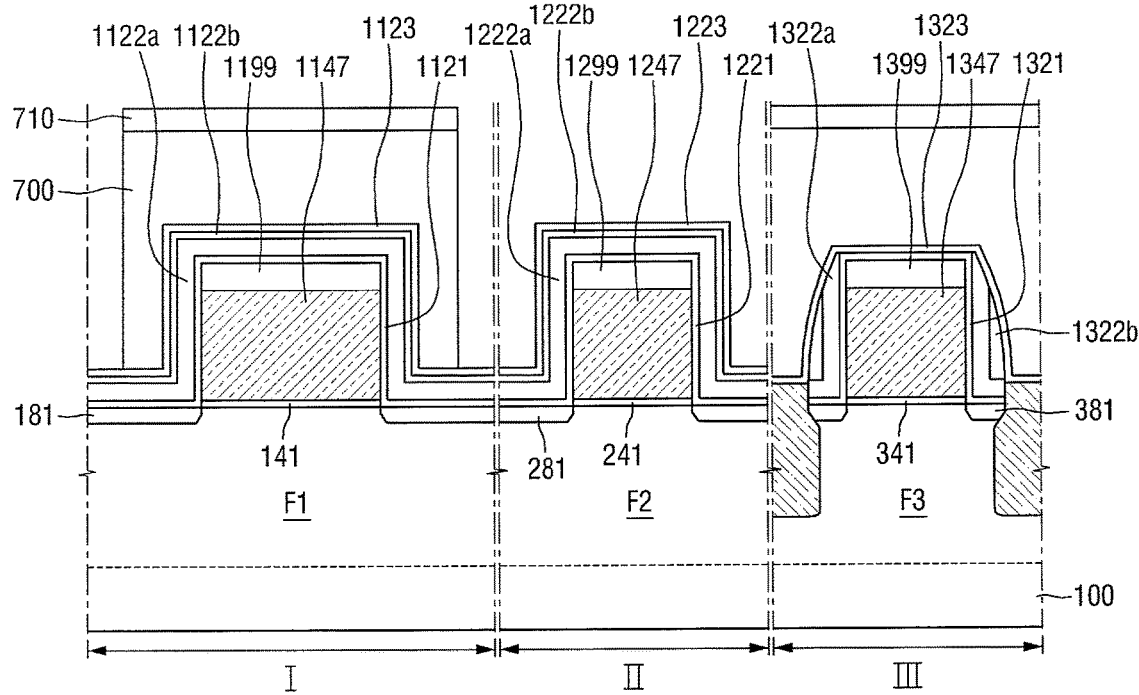

Referring to FIG. 20, mask patterns 700 and 710 configured to cover the third region III and to expose a portion of the first region I and expose the second region II may be formed on the result of FIG. 19. The mask patterns 700 and 710 may be, for example, two layers. That is, an H—SOH 700 may be formed to sufficiently cover the first region I and the second region II, and the oxide layer 710 may be formed on the H—SOH 700 using an ALD scheme.

In an exemplary embodiment in accordance with principles of inventive concepts, the mask patterns 700 and 710 cover a portion of the first region I. That is, the mask patterns 700 and 710 completely cover the first sacrificial gate 1147, also completely cover a spacer insulating layer formed on the sidewall of the first sacrificial gate 1147, and cover a portion of a spacer insulating layer formed on the top surface of the first fin F1.

Figure 21:
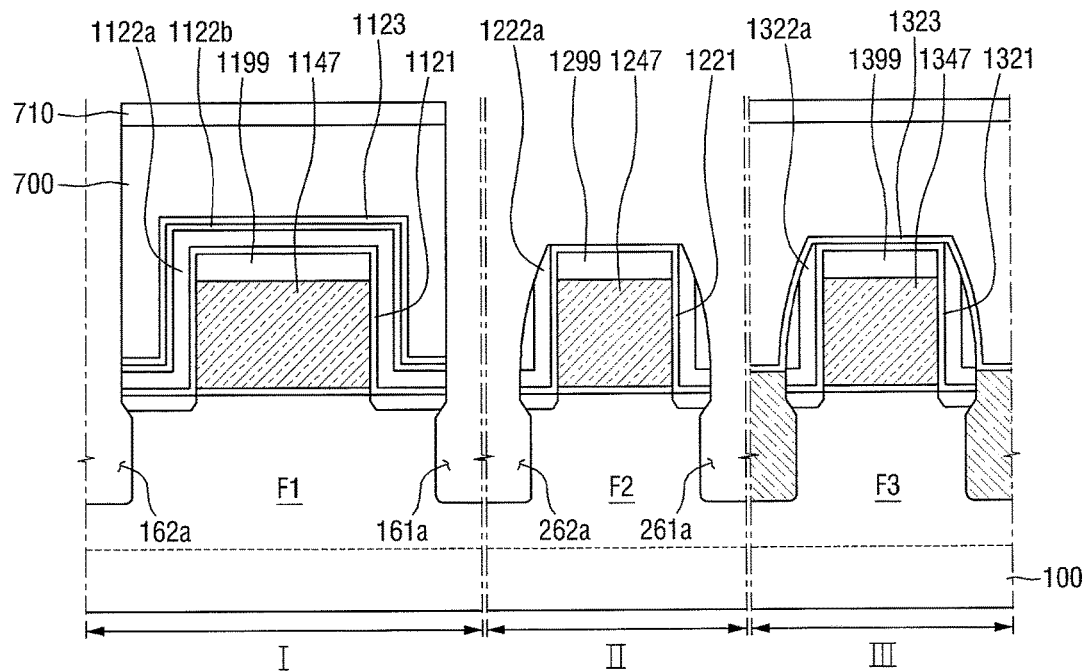

Referring to FIG. 21, using the mask patterns 700 and 710 and using, for example, a dry etching, trenches 161a and 162a may be formed around the first metal gate 147 of the first region I, and trenches 261a and 262a may be formed around the second metal gate 247 of the second region II.

That is, the trenches 161a and 162a, and the trenches 261a and 262a may be formed using a single mask 700 or 710. That is, there is no need to use an additional mask in an exemplary embodiment in accordance with principles of inventive concepts. Next, referring to FIG. 22, the first elevated source/drain 161 and 162 may be formed within the trenches 161a and 162a of the first region I, and the second elevated source/drain 261 and 262 may be formed within the trenches 261a and 262a of the second region II. The first elevated source/drain 161 and 162 and the second elevated source/drain 261 and 262 may be formed using, for example, an epitaxial growth scheme, and may be in-situ doped with, for example, N-type impurities. The first elevated source/drain 161 and 162 may be grown to protrude upward from the first fin F1, and the second elevated source/drain 261 and 262 may be grown to protrude upward from the second fin F2.

Figure 22:
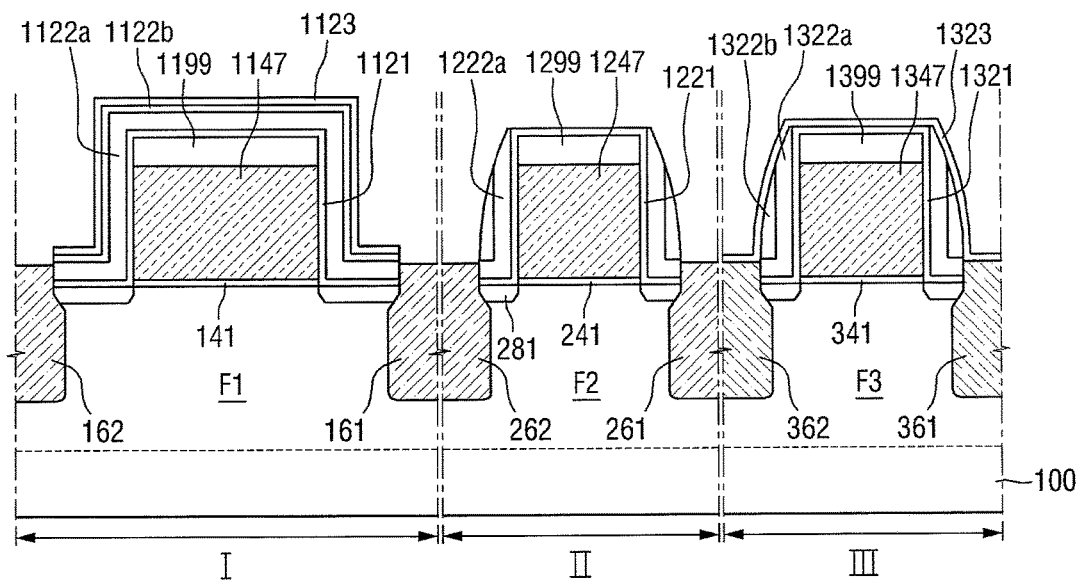
Figure 23:
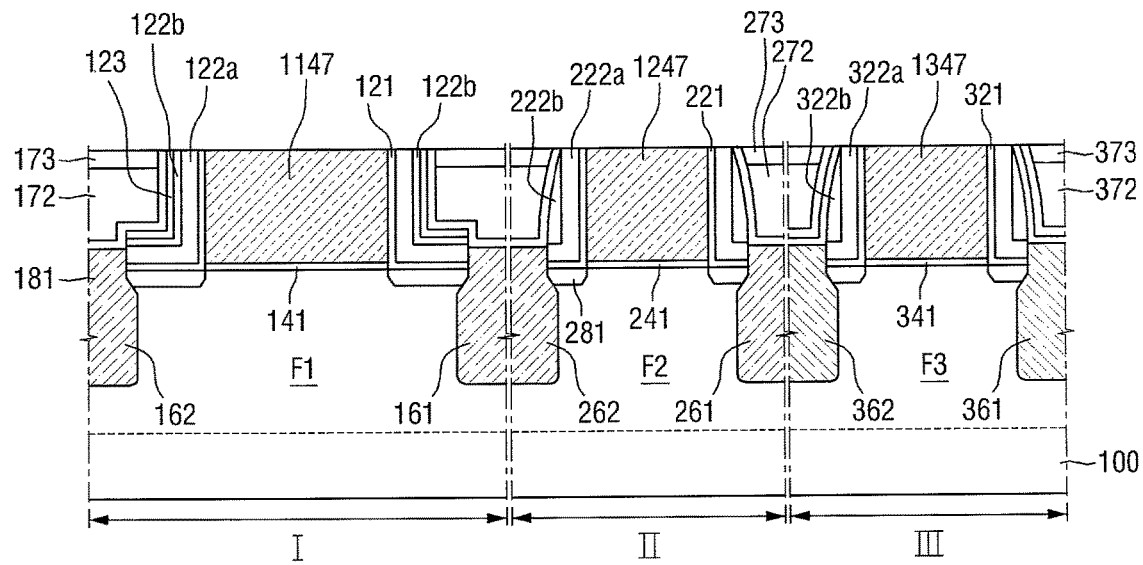

Next, referring to FIG. 23, interlayer insulating layers 171, 172, and 173, 271, 272, and 273, and 371, 372, and 373 may be formed on the result of FIG. 22. That is, passivation layers 171, 271, and 371 are conformally formed on the result of FIG. 22. The insulating layers 172, 272, and 372 may be formed on the passivation layers 171, 271, and 371 to cover the first transistor 101 through the third transistor 103. Next, the insulating layers 173, 273, and 373 may be formed on the insulating layers 172, 272, and 372. The passivation layers 171, 271, and 371 may be, for example, SiN, the insulating layers 172, 272, and 372 may be, for example, FCVD, and the insulating layers 173, 273, and 373 may be, for example, HDP.

Next, referring again to FIG. 10, the first sacrificial gate 1147 of the first transistor 101, the second sacrificial gate 1247 of the second transistor 102, and the third sacrificial gate 1347 of the third transistor 103 are flattened to be exposed.

Next, the exposed first sacrificial gate 1147 through the third sacrificial gate 1347 are removed.

Next, the sacrificial insulating layers 241 and 341 formed on the second region II and the third region III are removed. In this exemplary embodiment in accordance with principles of inventive concepts, the sacrificial insulating layer 141 formed on the first region I is not removed.

Next, the interface layers 242 and 342 may be formed on the second region II and the third region III, and the interface layer 142 may be formed on the sacrificial insulating layer 141 of the first region I.

Next, the high dielectric layers 145, 245, and 345 may be formed on the interface layers 142, 242, and 342, respectively.

Next, the first metal gate 147 through the third metal gate 347 may be formed on the first region I through the third region III, respectively.

Figure 24:
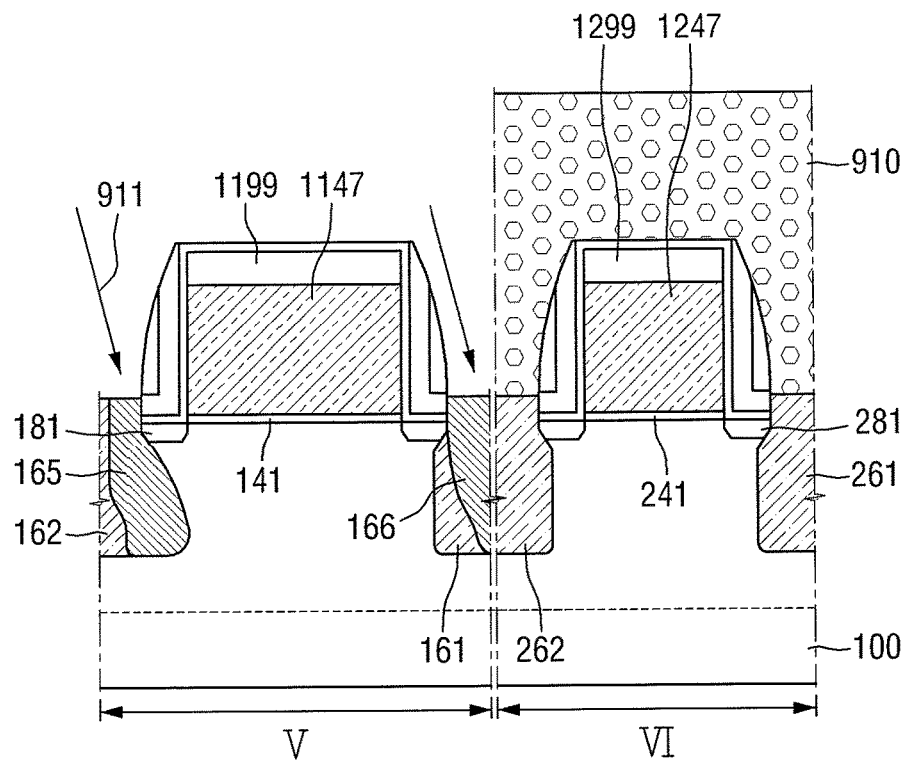
FIGS. 24 and 25 are cross-sectional views illustrating intermediate operations to describe the fabricating method of the semiconductor device 10 according to the tenth exemplary embodiment in accordance with principles of inventive concepts.
Figure 25:
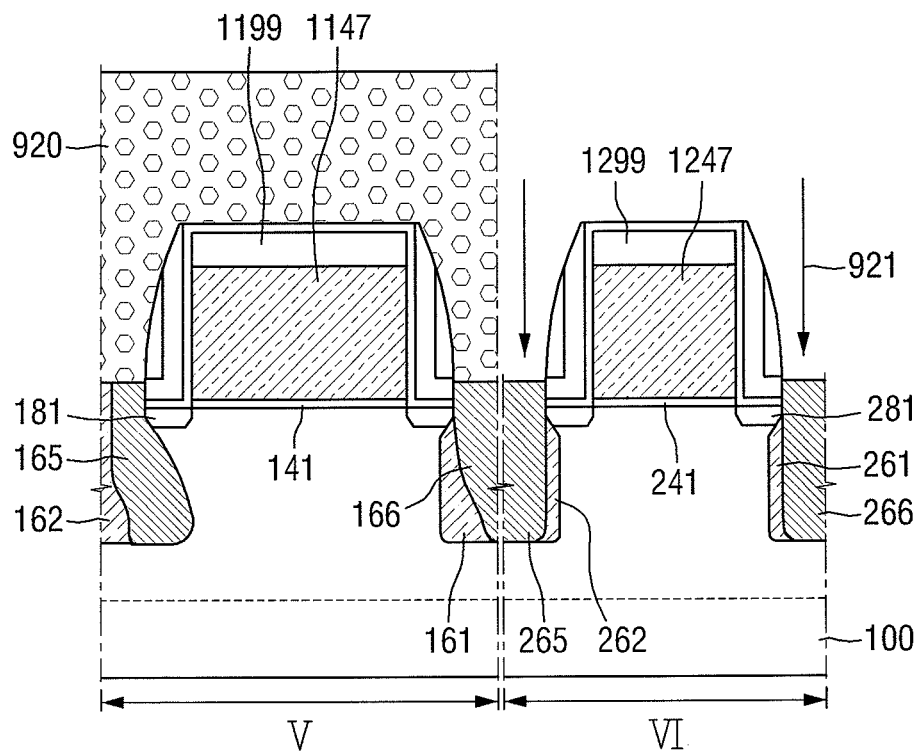

Hereinafter, an exemplary fabricating method of the semiconductor device 10 according to the tenth exemplary embodiment in accordance with principles of inventive concepts will be described with reference to FIG. 12 and FIGS. 24 and 25. FIGS. 24 and 25 are cross-sectional views illustrating intermediate operations to describe the fabricating method of the semiconductor device 10 according to the tenth exemplary embodiment in accordance with principles of inventive concepts.

Initially, referring to FIG. 24, the fifth region V and the sixth region VI are defined within the substrate 100, and the fifth transistor 105 that is a high voltage transistor may be formed in the fifth region V. The sixth transistor 106 that is a regular transistor may be formed in the sixth region VI.

Next, a mask pattern 910 configured to expose the fifth region V and cover the sixth region VI may be formed.

The first plug dopant region 165 and the second plug dopant region 166 may be formed using the mask pattern 910. Specifically, the first plug dopant region 165 and the second plug dopant region 166 may be formed through a tilted implant process 911, for example. For example, "P" may be doped and, for example, implant 911 may be performed by tilting about 20 degrees from a plane vertical to the substrate 100.

As a result, the first plug dopant region 165 may be formed to be extended to an inside of the first elevated source 162 and a lower portion of the first spacer structure 120. The second plug dopant region 166 may be formed within the first elevated drain 161. In particular, the second plug dopant region 166 may be formed to not overlap with the first spacer structure 120.

Next, referring to FIG. 25, a mask pattern 920 configured to expose the sixth region VI and to cover the fifth region V may be formed.

The third plug dopant region 265 and the fourth plug dopant region 266 may be formed using the mask pattern 920. Specifically, the third plug dopant region 265 and the fourth plug dopant region 266 may be formed through a non-tilted implant process 921.

Referring again to FIG. 12, the sacrificial gate 1199 of the fifth transistor 105 and the sacrificial gate 1299 of the sixth transistor 106 are flattened to be exposed.

Next, the exposed sacrificial gate 1199 and sacrificial gate 1299 are removed.

Next, the sacrificial insulating layer 241 formed on the sixth region VI is removed. In this exemplary embodiment in accordance with principles of inventive concepts, the sacrificial insulating layer 141 formed on the fifth region V is not removed.

Next, the interface layers 142 and 242 may be formed on the fifth region V and the sixth region VI, respectively.

Next, the first metal gate 147 and the first metal gate 247 may be formed on the fifth region V and the sixth region VI, respectively.

Hereinafter, a fabricating method of the semiconductor device 11 according to the eleventh exemplary embodiment in accordance with principles of inventive concepts will be described with reference to FIG. 13 and FIGS. 26 to 31. FIGS. 26 to 31 are cross-sectional views illustrating intermediate operations to describe the fabricating method of the semiconductor device 11.

Figure 26:
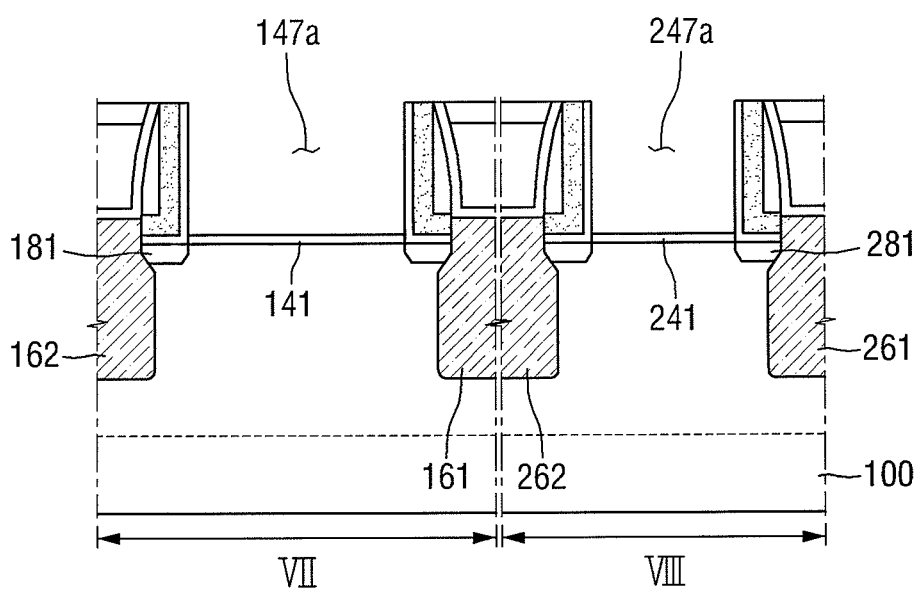
FIGS. 26 to 31 are cross-sectional views illustrating intermediate operations to describe the fabricating method of the semiconductor device 11 according to the eleventh e exemplary embodiment in accordance with principles of inventive concepts.

Referring to FIG. 26, a trench 147a may be formed by removing a sacrificial gate of a transistor formed on the seventh region VII, and a trench 247a may be formed by removing a sacrificial gate of a transistor formed on the eighth region VIII. The sacrificial insulating layers 141 and 241 within the trenches 147a and 247a are exposed.

Figure 27:
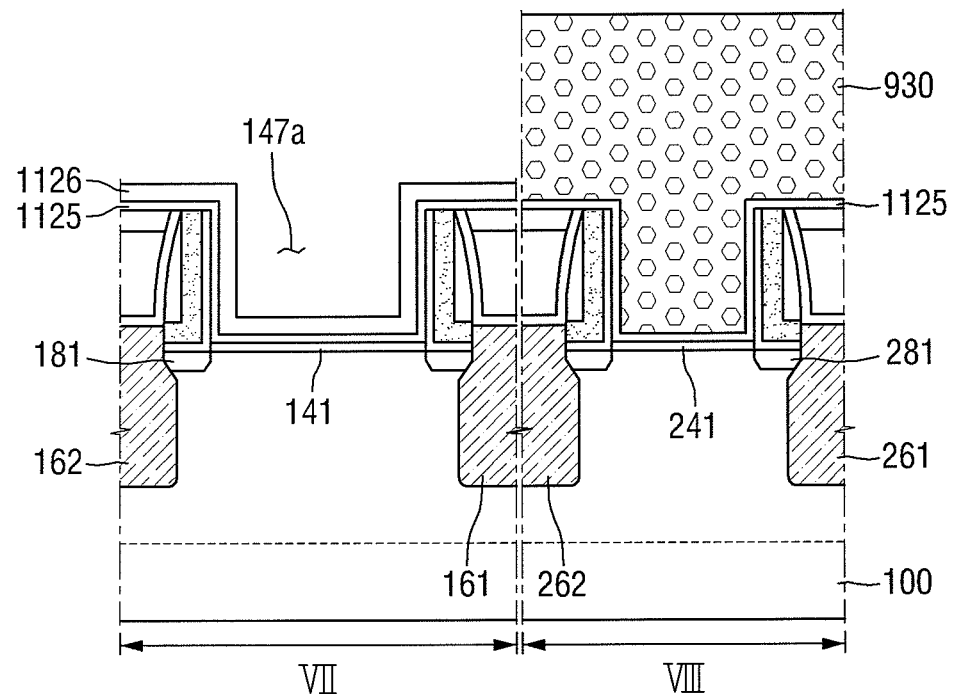

Referring to FIG. 27, an inner spacer insulating layer 1125 is conformally formed on the result of FIG. 26. The inner spacer insulating layer 1125 may be an oxide layer, for example.

Next, a mask 930 configured to cover the eighth region VIII and expose the seventh region VII may be formed. An inner spacer insulating layer 1126 is conformally formed on the exposed seventh region VII. In this exemplary embodiment in accordance with principles of inventive concepts, the inner spacer insulating layer 1126 may be a low dielectric layer.

Figure 28:
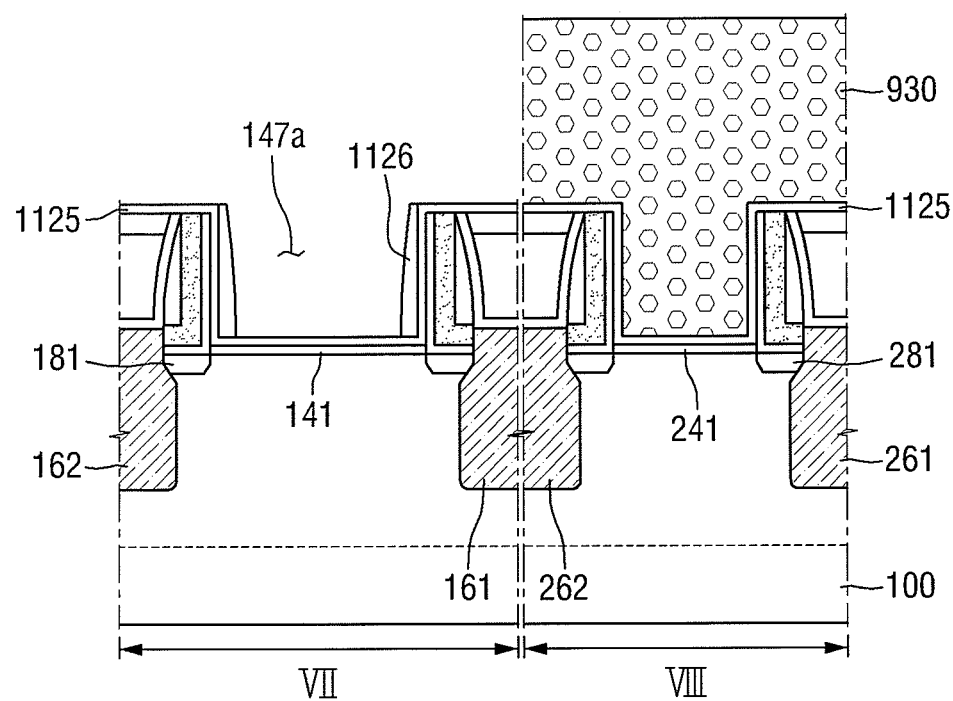

Next, referring to FIG. 28, the inner spacer insulating layer 1126 is etched by performing an etch-back process using the mask 930.

Figure 29:
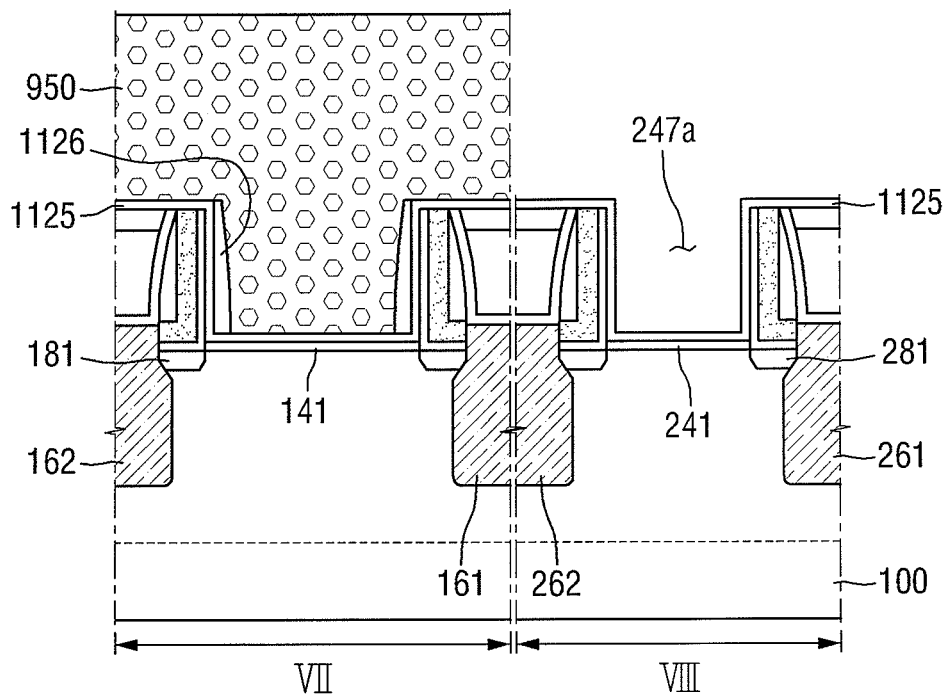

Next, referring to FIG. 29, a mask 950 configured to cover the seventh region VII and expose the eighth VIII may be formed.

Figure 30:
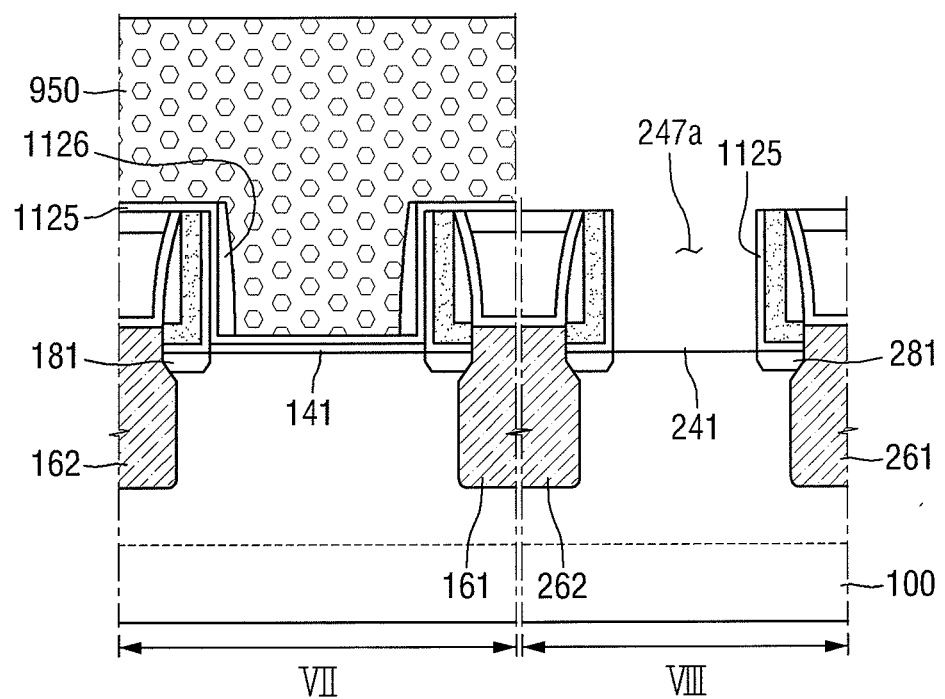

Next, referring to FIG. 30, the sacrificial insulating layer 241 and the inner spacer insulating layer 1125 are removed using the mask 950. For example, wet etching may be performed using hydrofluoric acid.

Next, the mask 950 is removed.

Figure 31:
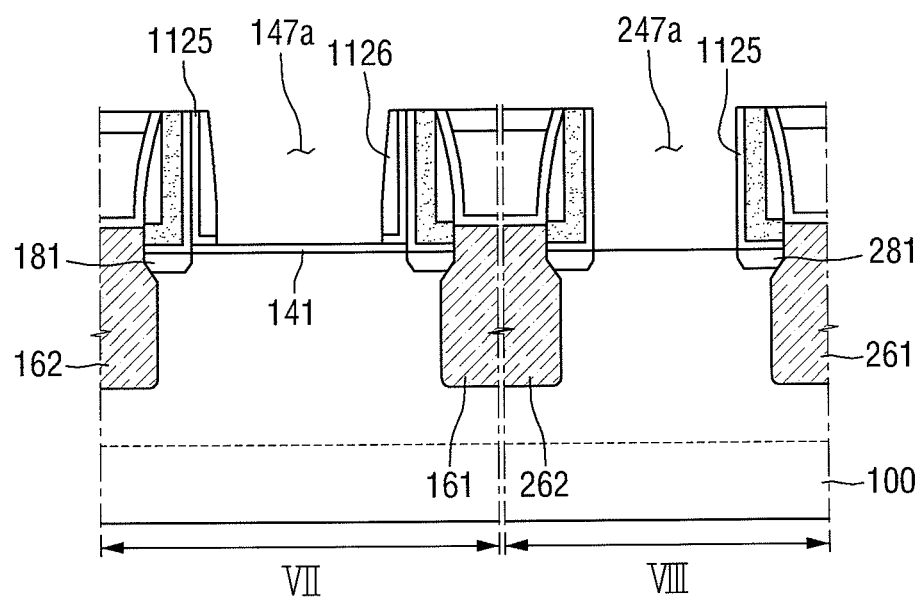

Next, referring to FIG. 31, the inner spacer insulating layer 1125 formed within the trench 147a of the seventh region VII is removed using, for example, wet etching with hydrofluoric acid. As a result, the inner spacer insulating layer 1125 is removed and the sacrificial insulating layer 141 remains on a bottom surface of the trench 147a.

A method of subsequently forming the gate insulating layers 141, 142, 145, 242, and 245, and the metal gates 147 and 247 are the same as the aforementioned fabricating method.

The foregoing is illustrative of inventive concepts and is not to be construed as limiting thereof. Although exemplary embodiments have been described, it will be appreciated that many modifications are possible without materially departing from the scope of inventive concepts. Accordingly, all such modifications are intended to be included within the scope of inventive concepts as defined in the claims.

What is claimed is:

1. A semiconductor device, comprising:
   a gate on a substrate;
   a gate insulating layer along a sidewall and a bottom surface of the gate;
   elevated source/drain regions formed on either side of the gate; and
   an L-shaped spacer structure between the gate and the elevated source/drain regions, wherein the spacer structure exposes a top surface of the elevated source/drain regions,
   wherein the spacer structure includes a first portion along the sidewall of the gate and a second portion connected to the first portion and along a top surface of the substrate, extending beyond the portion along the sidewall of the gate, thereby extending the distance between the gate and source/drain regions on either side of the gate by a distance greater than the thickness of the spacer structure,
   wherein the spacer structure includes first through $n^{th}$ spacers that are sequentially stacked, and n denotes a natural number greater than or equal to "2",
   wherein the $n^{th}$ spacer disposed at an outermost portion in the spacer structure is provided in an L shape,
   wherein a low doped drain (LDD) region is disposed in a lower portion of the spacer structure,
   wherein a bottom surface of the spacer structure contacts with the low doped drain region and does not contact with the elevated source/drain regions.

2. The semiconductor device of claim 1, wherein the top surface of the gate and a top surface of the first portion are disposed on the same plane.

3. The semiconductor device of claim 1, wherein a width of the first portion is constant.

4. The semiconductor device of claim 1, wherein each of the first through $n^{th}$ spacers is provided in an L shape.

5. The semiconductor device of claim 1, wherein the spacer structure directly contacts with an interlayer insulating layer, and the interlayer insulating layer directly contacts with a sidewall of the first portion and a top surface of the second portion of the spacer structure.

6. The semiconductor device of claim 5, wherein the interlayer insulating layer includes a passivation layer formed along a side surface of the spacer structure and a top surface of elevated source/drain.

7. The semiconductor device of claim 1, further comprising:
   elevated source/drain within a fin on both sides of the gate and contacting with the spacer structure.

8. The semiconductor device of claim 7, further comprising:
   a first plug dopant region extended to an inside of the elevated source and a lower portion of the spacer structure and a second plug dopant region formed within the elevated drain.

9. The semiconductor device of claim 8, wherein the second plug dopant region is not overlapped with the spacer structure.

10. The semiconductor device of claim 1, further comprising:
    an inner spacer between the spacer structure and the gate.

11. The semiconductor device of claim 10, wherein the inner spacer is provided in a chamfered I shape.

12. The semiconductor device of claim 1, wherein the elevated source/drain is an epitaxial layer.

13. The semiconductor device of claim 1, wherein the low doped drain (LDD) region is a portion of the substrate.

14. A semiconductor device, comprising:
a gate on a substrate;
a gate insulating layer along a sidewall and bottom surface of the gate;
elevated source/drain regions formed on either side of the gate;
an L-shaped spacer structure between the gate and the elevated source/drain regions, wherein the spacer structure exposes a top surface of the elevated source/drain regions; and
a low doped drain (LDD) region between the spacer structure and elevated source/drain regions, wherein the spacer structure includes a first portion along the sidewall of the gate and as second portion connected to the first portion and along a top surface of the substrate,
wherein the spacer structure includes first through $n^{th}$ spacers that are sequentially stacked, and n denotes a natural number greater than or equal to "2",
wherein the $n^{th}$ spacer disposed at an outermost portion in the spacer structure is provided in an L shape.

15. The semiconductor device of claim 14, wherein the elevated source/drain is an epitaxial layer.

16. The semiconductor device of claim 14, wherein the low doped drain (LDD) region is a portion of the substrate.

17. A semiconductor device, comprising:
a gate on a substrate;
a gate insulating layer along a sidewall and bottom surface of the gate;
elevated source/drain regions formed on either side of the gate;
an L-shaped spacer structure between the gate and the elevated source/drain regions, wherein the spacer structure exposes a top surface of the elevated source/drain regions;
a low doped drain (LDD) region between the spacer structure and elevated source/drain regions; and
a passivation layer conformally formed along the side surface of the L-shaped spacer structures and the top surface of the elevated source/drain regions,
wherein the spacer structure includes a first portion along the sidewall of the gate and a second portion connected to the first portion and along a top surface of the substrate,
wherein the spacer structure includes first through $n^{th}$ spacers that are sequentially stacked, and n denotes a natural number greater than or equal to "2",
wherein the $n^{th}$ spacer disposed at an outermost portion in the spacer structure is provided in an L shape.

18. The semiconductor device of claim 17, wherein the low doped drain (LDD) region is disposed in a lower portion of the spacer structure, wherein a bottom surface of the spacer structure contacts with the low doped drain region and does not contact with the elevated source/drain region.

19. The semiconductor device of claim 17, wherein the elevated source/drain is an epitaxial layer.

20. The semiconductor device of claim 17, wherein the low doped drain (LDD) region is a portion of the substrate.

* * * * *